United States Patent
Yang et al.

(10) Patent No.: US 12,314,599 B2
(45) Date of Patent: May 27, 2025

(54) METHOD FOR ADJUSTING A READ VOLTAGE LEVEL OR LOG LIKELIHOOD RATIO OF A MEMORY BASED ON A CALCULATED BIT CHANGE RATIO, MEMORY CONTROLLING CIRCUIT UNIT, AND MEMORY STORAGE DEVICE

(71) Applicant: PHISON ELECTRONICS CORP., Miaoli (TW)

(72) Inventors: Yu-Siang Yang, New Taipei (TW); Wei Lin, Taipei (TW); Shih-Jia Zeng, Hsinchu (TW); An-Cheng Liu, Taipei (TW); Yu-Cheng Hsu, Yilan County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 38 days.

(21) Appl. No.: 17/336,347

(22) Filed: Jun. 2, 2021

(65) Prior Publication Data

US 2022/0365706 A1 Nov. 17, 2022

(30) Foreign Application Priority Data

May 12, 2021 (TW) .................................. 110117140

(51) Int. Cl.
*G06F 3/06* (2006.01)
(52) U.S. Cl.
CPC .......... *G06F 3/0655* (2013.01); *G06F 3/0604* (2013.01); *G06F 3/0679* (2013.01)

(58) Field of Classification Search
CPC .... G06F 3/0655; G06F 3/0604; G06F 3/0679; H03M 13/3927
See application file for complete search history.

(56) References Cited

U.S. PATENT DOCUMENTS

| | | | |
|---|---|---|---|
| 8,099,652 B1* | 1/2012 | Alrod | G11C 16/26 714/763 |
| 9,450,610 B1* | 9/2016 | Micheloni | H03M 13/6325 |
| 11,609,699 B2* | 3/2023 | Sun | G06F 3/0656 |
| 2009/0006922 A1* | 1/2009 | Yoshida | G11B 20/1803 714/755 |
| 2009/0216937 A1* | 8/2009 | Yasufuku | G06F 12/0246 710/22 |

OTHER PUBLICATIONS

Peleato et al., Adaptive Read Thresholds for NAND Flash, 2015, IEEE, pp. 3069-3081 (Year: 2015).*

* cited by examiner

*Primary Examiner* — Gary W. Cygiel
(74) *Attorney, Agent, or Firm* — JCIPRNET

(57) ABSTRACT

A data accessing method, a memory controlling circuit unit, and a memory storage device are provided. The method includes: reading a codeword stored in a physical programming unit, and calculating a bit change ratio of a bit value change in dummy data included in the codeword; adjusting a read voltage level or a log likelihood ratio according to the bit change ratio; and performing a decoding operation on the codeword by using the adjusted read voltage level or the adjusted log likelihood ratio.

21 Claims, 14 Drawing Sheets

METHOD FOR ADJUSTING A READ VOLTAGE LEVEL OR LOG LIKELIHOOD RATIO OF A MEMORY BASED ON A CALCULATED BIT CHANGE RATIO, MEMORY CONTROLLING CIRCUIT UNIT, AND MEMORY STORAGE DEVICE

CROSS-REFERENCE TO RELATED APPLICATION

This application claims the priority benefit of Taiwan application serial no. 110117140, filed on May 12, 2021. The entirety of the above-mentioned patent application is hereby incorporated by reference herein and made a part of this specification.

BACKGROUND

Technical Field

The disclosure relates to a memory data accessing technology, and particularly relates to a data accessing method, a memory controlling circuit unit, and a memory storage device.

Description of Related Art

Digital cameras, mobile phones, and MP3 have grown rapidly in the past few years, which has led to a rapid increase in consumer demand for storage media. Since the rewritable non-volatile memory module (for example, a flash memory) has characteristics such as non-volatile data, power saving, small size, no mechanical structure, fast reading and writing speed, etc., the rewritable non-volatile memory module is most suitable for the portable electronic product, such as a notebook computer. A solid state drive is a memory storage device that uses the flash memory as a storage medium. Therefore, the flash memory industry has become a very popular part of the electronics industry in recent years.

Many memory controllers are equipped with error checking and correcting circuits. The error checking and correcting circuit is configured to check and correct errors in data read from the rewritable non-volatile memory module. However, the threshold voltage distribution of a data bit in the erased state is usually different from the threshold voltage distribution in other programmed states, which makes it difficult to find certain errors and increases the probability of decoding failure.

SUMMARY

The disclosure provides a data accessing method, a memory controlling circuit unit, and a memory storage device, which can improve decoding efficiency.

An exemplary embodiment of the disclosure provides a data accessing method for a rewritable non-volatile memory module. The rewritable non-volatile memory module includes multiple physical erasing units. Each of the physical erasing units has multiple physical programming units. The data accessing method includes the following steps. A codeword stored in a physical programming unit is read, and a bit change ratio of a bit value change in dummy data included in the codeword is calculated. A read voltage level or a log likelihood ratio is adjusted according to the bit change ratio. A decoding operation is performed on the codeword by using the adjusted read voltage level or the adjusted log likelihood ratio.

In an exemplary embodiment of the disclosure, the step of adjusting the read voltage level or the log likelihood ratio according to the bit change ratio includes the following step. A compensation value is determined according to the bit change ratio, and the read voltage level is adjusted according to the compensation value.

In an exemplary embodiment of the disclosure, the step of adjusting the read voltage level or the log likelihood ratio according to the bit change ratio includes the following step. A compensation value is determined according to the bit change ratio, and the log likelihood ratio is adjusted according to the compensation value.

In an exemplary embodiment of the disclosure, the dummy data is data with bits being all "1".

In an exemplary embodiment of the disclosure, the bit change ratio includes a ratio of bit "1" changing to "0" in the dummy data.

In an exemplary embodiment of the disclosure, the decoding operation includes a hard-bit mode decoding operation. The data accessing method includes the following step. The codeword stored in the physical programming unit is read by using the adjusted read voltage level, and the hard-bit mode decoding operation is performed on the codeword.

In an exemplary embodiment of the disclosure, the decoding operation includes a soft-bit mode decoding operation. The data accessing method includes the following step. The soft-bit mode decoding operation is performed on the codeword according to the adjusted log likelihood ratio.

An exemplary embodiment of the disclosure provides a memory controlling circuit unit for controlling a rewritable non-volatile memory module. The memory controlling circuit unit includes a host interface, a memory interface, an error checking and correcting circuit, and a memory management circuit. The host interface is configured to couple to a host system. The memory interface is configured to couple to the rewritable non-volatile memory module. The rewritable non-volatile memory module includes multiple physical erasing units. Each of the physical erasing units has multiple physical programming units. The memory management circuit is coupled to the host interface, the memory interface, and the error checking and correcting circuit. The memory management circuit is configured to read a codeword stored in the physical programming unit, and calculate a bit change ratio of a bit value change in dummy data included in the codeword. The memory management circuit is further configured to adjust a read voltage level or a log likelihood ratio according to the bit change ratio. In addition, the error checking and correcting circuit is further configured to perform a decoding operation on the codeword by using the adjusted read voltage level or the adjusted log likelihood ratio.

In an exemplary embodiment of the disclosure, the operation of adjusting the read voltage level or the log likelihood ratio according to the bit change ratio includes the following step. A compensation value is determined according to the bit change ratio, and the read voltage level is adjusted according to the compensation value.

In an exemplary embodiment of the disclosure, the operation of adjusting the read voltage level or the log likelihood ratio according to the bit change ratio includes the following step. A compensation value is determined according to the bit change ratio, and the log likelihood ratio is adjusted according to the compensation value.

In an exemplary embodiment of the disclosure, the dummy data is data with bits being all "1".

In an exemplary embodiment of the disclosure, the bit change ratio includes a ratio of bit "1" changing to "0" in the dummy data.

In an exemplary embodiment of the disclosure, the decoding operation includes a hard-bit mode decoding operation. The error checking and correcting circuit is further configured to read the codeword stored in the physical programming unit by using the adjusted read voltage level, and perform the hard-bit mode decoding operation on the codeword.

In an exemplary embodiment of the disclosure, the decoding operation includes a soft-bit mode decoding operation, and the error checking and correcting circuit is further configured to perform the soft-bit mode decoding operation on the codeword according to the adjusted log likelihood ratio.

An exemplary embodiment of the disclosure provides a memory storage device, which includes a connection interface unit, a rewritable non-volatile memory module, and a memory controlling circuit unit. The connection interface unit is configured to couple to a host system. The rewritable non-volatile memory module includes multiple physical erasing units. Each of the physical erasing units has multiple physical programming units. The memory controlling circuit unit is coupled to the connection interface unit and the rewritable non-volatile memory module. The memory controlling circuit unit is configured to read a codeword stored in a physical programming unit, and calculate a bit change ratio of a bit value change in dummy data included in the codeword. The memory controlling circuit unit is further configured to adjust a read voltage level or a log likelihood ratio according to the bit change ratio. The memory controlling circuit unit is further configured to perform a decoding operation on the codeword by using the adjusted read voltage level or the adjusted log likelihood ratio.

In an exemplary embodiment of the disclosure, the operation of adjusting the read voltage level or the log likelihood ratio according to the bit change ratio includes the following step. A compensation value is determined according to the bit change ratio, and the read voltage level is adjusted according to the compensation value.

In an exemplary embodiment of the disclosure, the operation of adjusting the read voltage level or the log likelihood ratio according to the bit change ratio includes the following step. A compensation value is determined according to the bit change ratio, and the log likelihood ratio is adjusted according to the compensation value.

In an exemplary embodiment of the disclosure, the dummy data is data with bits being all "1".

In an exemplary embodiment of the disclosure, the bit change ratio includes a ratio of bit "1" changing to "0" in the dummy data.

In an exemplary embodiment of the disclosure, the decoding operation includes a hard-bit mode decoding operation, and the memory controlling circuit unit is further configured to read the codeword stored in the physical programming unit by using the adjusted read voltage level, and perform the hard-bit mode decoding operation on the codeword.

In an exemplary embodiment of the disclosure, the decoding operation includes a soft-bit mode decoding operation, and the memory controlling circuit unit is further configured to perform the soft-bit operation decoding operation on the codeword according to the adjusted log likelihood ratio.

Based on the above, in the embodiments of the disclosure, the read voltage level or the log likelihood ratio is adjusted according to the bit change ratio of the dummy data, and the decoding operation is executed according to the adjusted read voltage level or log likelihood ratio. Accordingly, the decoding efficiency can be improved, thereby improving the efficiency and correctness of reading data.

In order for the features and advantages of the disclosure to be more comprehensible, the following specific embodiments are described in detail in conjunction with the accompanying drawings.

BRIEF DESCRIPTION OF THE DRAWINGS

FIG. 15A to FIG. 15C are an example of dummy data according to an exemplary embodiment.

DETAILED DESCRIPTION OF DISCLOSED EMBODIMENTS

Generally speaking, a memory storage device (also known as a memory storage system) includes a rewritable non-volatile memory module and a controller (also known as a control circuit unit). Usually, the memory storage device is used together with a host system, so that the host system may write data into the memory storage device or read data from the memory storage device.

Figure 1:
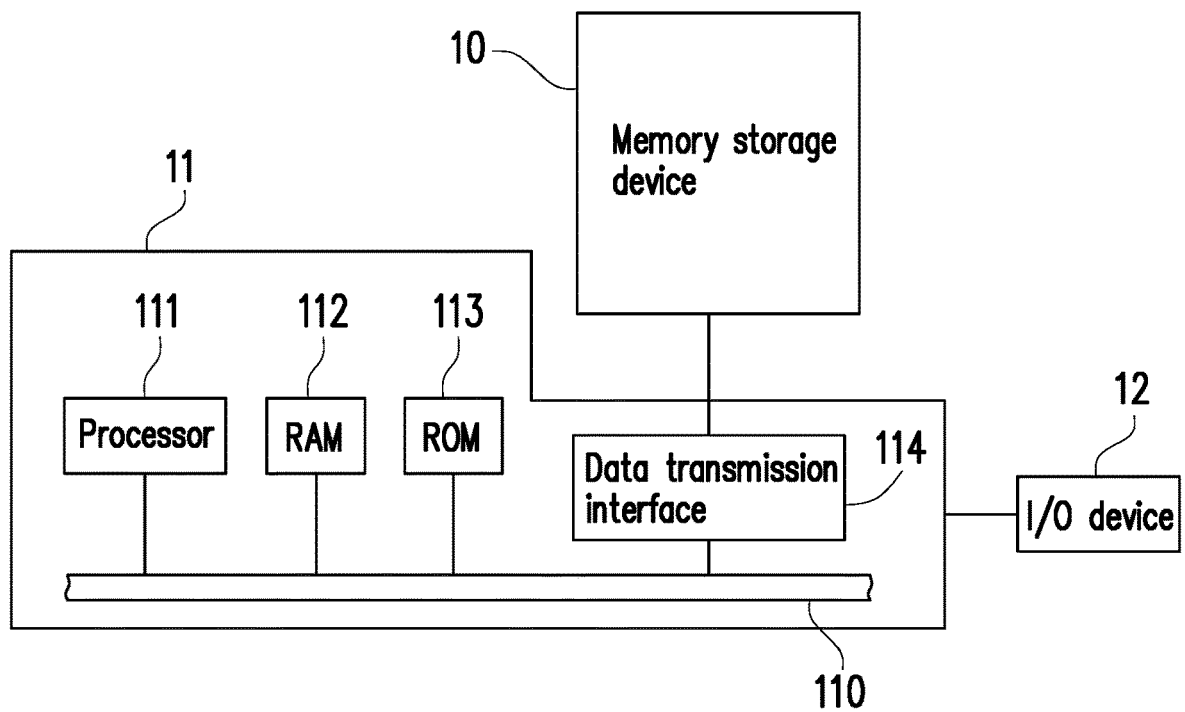
FIG. 1 is a schematic diagram of a host system, a memory storage device, and an input/output (I/O) device according to an exemplary embodiment.
Figure 2:
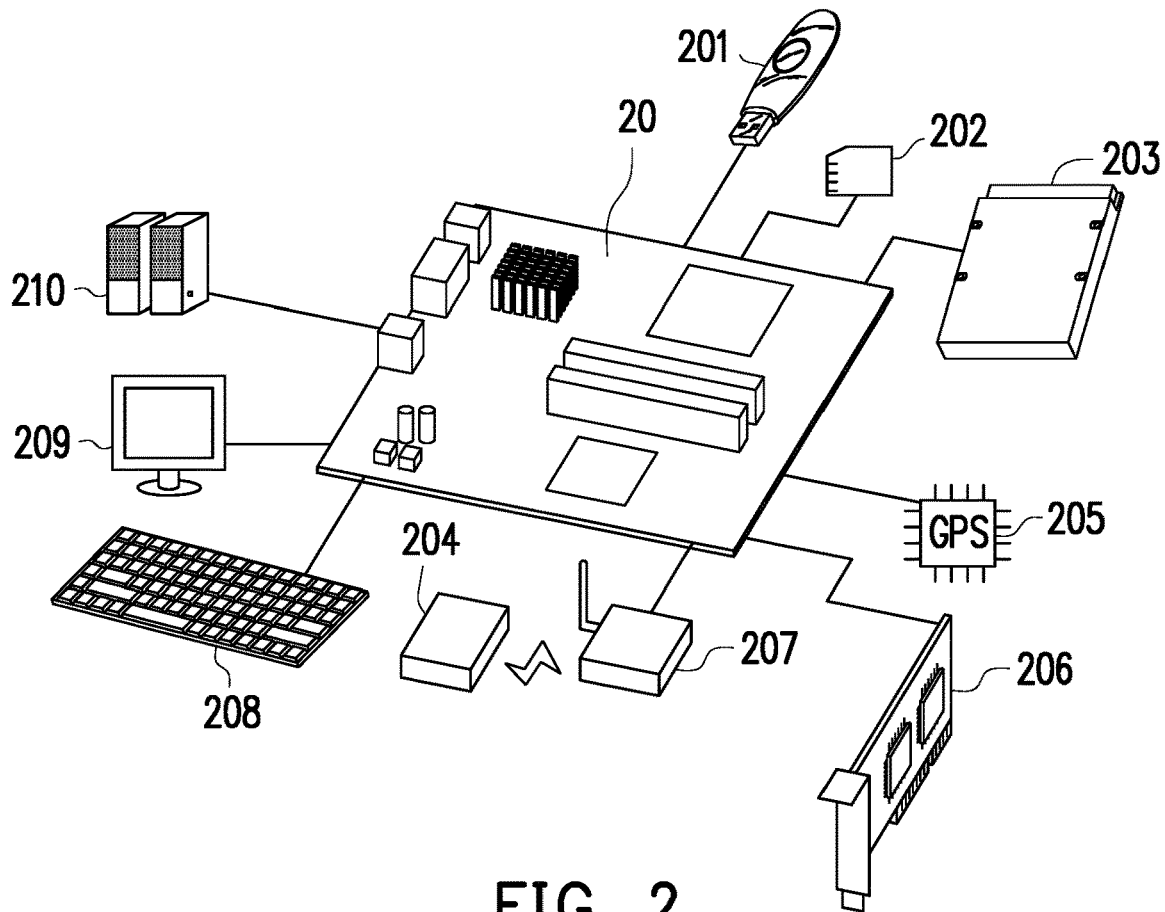
FIG. 2 is a schematic diagram of a host system, a memory storage device, and an I/O device according to another exemplary embodiment.

FIG. 1 is a schematic diagram of a host system, a memory storage device, and an input/output (I/O) device according to an exemplary embodiment. FIG. 2 is a schematic diagram of a host system, a memory storage device, and an I/O device according to another exemplary embodiment.

Please refer to FIG. 1 and FIG. 2. A host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In this exemplary embodiment, the host system 11 is coupled to a memory storage device 10 through the data transmission interface 114. For example, the host system 11 may write data into the memory storage device 10 or read data from the memory storage device 10 via the data transmission interface 114. In addition, the host system 11 is coupled to the I/O device 12 through the system bus 110. For example, the host system 11 may send an output signal to the I/O device 12 or receive an input signal from the I/O device 12 via the system bus 110.

In this exemplary embodiment, the processor 111, the random access memory 112, the read only memory 113, and the data transmission interface 114 may be disposed on a motherboard 20 of the host system 11. The number of the data transmission interface 114 may be one or more. Through the data transmission interface 114, the motherboard 20 may be coupled to the memory storage device 10 via a wired or wireless manner. The memory storage device 10 may be, for example, a flash drive 201, a memory card 202, a solid state drive (SSD) 203, or a wireless memory storage device 204. The wireless memory storage device 204 may be, for example, a near field communication (NFC) memory storage device, a wireless fax (WiFi) memory storage device, a Bluetooth memory storage device, a low-power Bluetooth memory storage device (for example, iBeacon), or other memory storage devices based on various wireless communication technologies. In addition, the motherboard 20 may also be coupled to a global positioning system (GPS) module 205, a network interface card 206, a wireless transmission device 207, a keyboard 208, a screen 209, a speaker 210, or various other I/O devices through the system bus 110. For example, in an exemplary embodiment, the motherboard 20 may access the wireless memory storage device 204 through the wireless transmission device 207.

Figure 3:
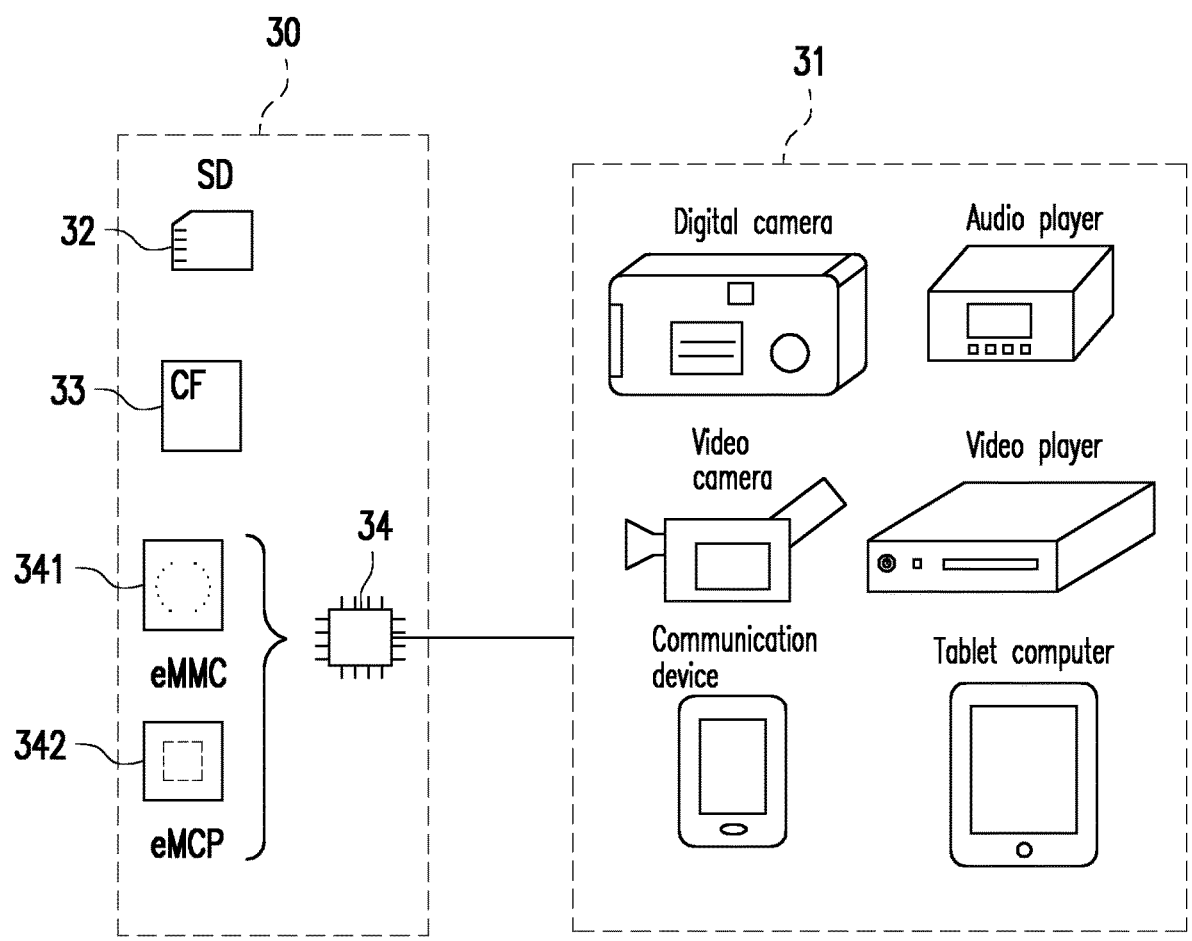
FIG. 3 is a schematic diagram of a host system and a memory storage device according to another exemplary embodiment.

In an exemplary embodiment, the host system is any system that may substantially cooperate with the memory storage device to store data. Although in the above exemplary embodiment, the host system is described as a computer system, FIG. 3 is a schematic diagram of a host system and a memory storage device according to another exemplary embodiment. Please refer to FIG. 3. In another exemplary embodiment, a host system 31 may also be a digital camera, a video camera, a communication device, an audio player, a video player, a tablet computer, or other systems, and a memory storage device 30 may be a secure digital (SD) card 32, a compact flash (CF) card 33, an embedded storage device 34, or various other non-volatile memory storage devices used thereby. The embedded storage device 34 includes an embedded multi media card (eMMC) 341, an embedded multi chip package (eMCP) storage device 342, and/or various other embedded storage devices in which a memory module is directly coupled onto a substrate of a host system.

Figure 4:
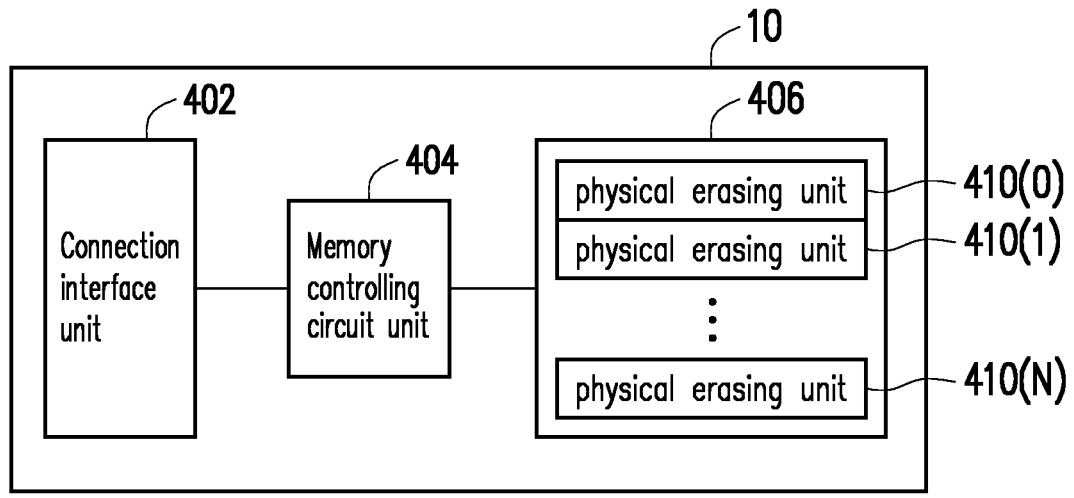
FIG. 4 is a schematic block diagram of a host system and a memory storage device according to an exemplary embodiment.

FIG. 4 is a schematic block diagram of a host system and a memory storage device according to an exemplary embodiment.

Please refer to FIG. 4. The memory storage device 10 includes a connection interface unit 402, a memory control circuit unit 404, and a rewritable non-volatile memory module 406.

In this exemplary embodiment, the connection interface unit 402 is compatible with the serial advanced technology attachment (SATA) standard. However, it must be understood that the disclosure is not limited thereto. The connection interface unit 402 may also conform to the parallel advanced technology attachment (PATA) standard, the Institute of Electrical and Electronic Engineers (IEEE) 1394 standard, the high-speed peripheral component interconnect express (PCI express) standard, the universal serial bus (USB) standard, the ultra high speed-I (UHS-I) interface standard, the ultra high speed-II (UHS-II) interface standard, the SD interface standard, the memory stick (MS) interface standard, the multi-chip package (MCP) interface standard, the multi media card (MMC) interface standard, the eMMC interface standard, the universal flash storage (UFS) interface standard, the eMCP interface standard, the CF interface standard, the integrated device electronics (IDE) standard, or other suitable standards. In this exemplary embodiment, the connection interface unit 402 may be packaged in a chip with the memory control circuit unit 404, or the connection interface unit 402 may be arranged outside a chip containing the memory control circuit unit.

The memory control circuit unit 404 is configured to execute multiple logic gates or control commands implemented in a hardware form or a firmware form, and perform operations such as data writing, reading, and erasing in the rewritable non-volatile memory module 406 according to a command of the host system 11.

The rewritable non-volatile memory module 406 is coupled to the memory control circuit unit 404 and is configured to store data written by the host system 11. The rewritable non-volatile memory module 406 has physical erasing units 410(0) to 410(N). For example, the physical erasing units 410(0) to 410(N) may belong to the same memory die or belong to different memory dies. Each physical erasing unit has multiple physical programming units. The physical programming units belonging to the same physical erasing unit may be independently written and simultaneously erased. However, it must be understood that the disclosure is not limited thereto, and each physical erasing unit may be composed of 64 physical programming units, 256 physical programming units, or any other number of physical programming units.

In more detail, the physical erasing unit is the smallest unit of erasure. That is, each physical erasing unit contains the smallest number of memory cells to be erased together. The physical programming unit is the smallest unit of programming. That is, the physical programming unit is the smallest unit of writing data. Each physical programming unit usually includes a data bit area and a redundant bit area. The data bit area contains multiple physical access addresses for storing user data and the redundant bit area is configured to store system data (for example, control information and error correcting codes). In this exemplary embodiment, the data bit area of each physical programming unit contains 8 physical access addresses, and the size of one physical access address is 512 bytes. However, in other exemplary embodiments, the data bit area may also contain more or less physical access addresses, and the disclosure does not limit the size and number of physical access addresses. For example, in an exemplary embodiment, the physical erasing unit is a physical block, and the physical programming unit is a physical page or a physical sector, but the disclosure is not limited thereto.

In this exemplary embodiment, the rewritable non-volatile memory module 406 is a single level memory cell (SLC) NAND flash memory module (that is, a flash memory module that may store 1 data bit in a memory cell), a multi level cell (MLC) NAND flash memory module (that is, a flash memory module that may store 2 data bits in a memory cell), a triple level cell (TLC) NAND flash memory module (that is, a flash memory module that may store 3 data bits in a memory cell), other flash memory modules, or other memory modules with the same characteristics.

Figure 5:
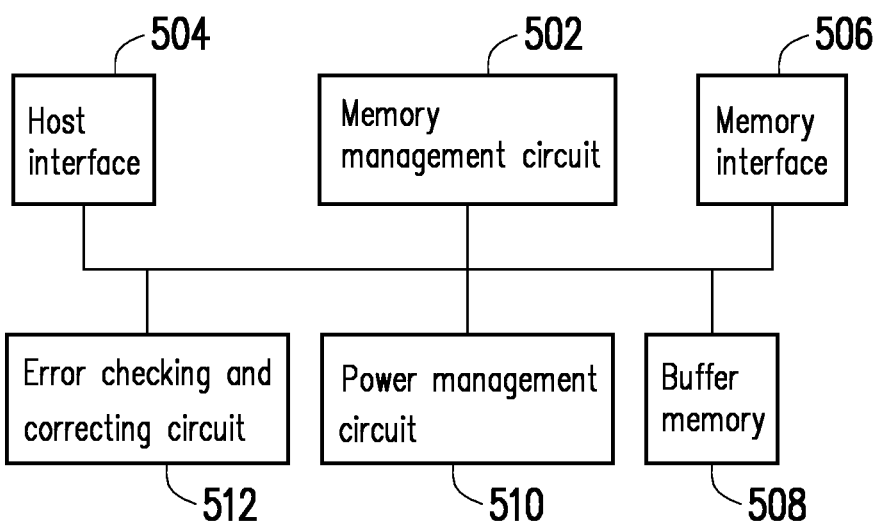
FIG. 5 is a schematic block diagram of a memory controlling circuit unit according to an exemplary embodiment.

FIG. 5 is a schematic block diagram of a memory controlling circuit unit according to an exemplary embodiment.

Please refer to FIG. 5. The memory controlling circuit unit 404 includes a memory management circuit 502, a host interface 504, a memory interface 506, a buffer memory 508, a power management circuit 510, and an error checking and correcting circuit 512.

The memory management circuit 502 is configured to control the overall operation of the memory control circuit unit 404. Specifically, the memory management circuit 502 has multiple control commands, and when the memory storage device 10 is operating, the control commands are executed to perform operations such as data writing, reading, and erasing. The following description of the operation of the memory management circuit 502 is equivalent to the description of the operation of the memory control circuit unit 404.

In this exemplary embodiment, the control commands of the memory management circuit 502 are implemented in a firmware form. For example, the memory management circuit 502 has a microprocessor unit (not shown) and a read only memory (not shown), and the control commands are burnt into the read only memory. When the memory storage device 10 is operating, the control commands are executed by the microprocessor unit to perform operations such as data writing, reading, and erasing.

Figure 6:
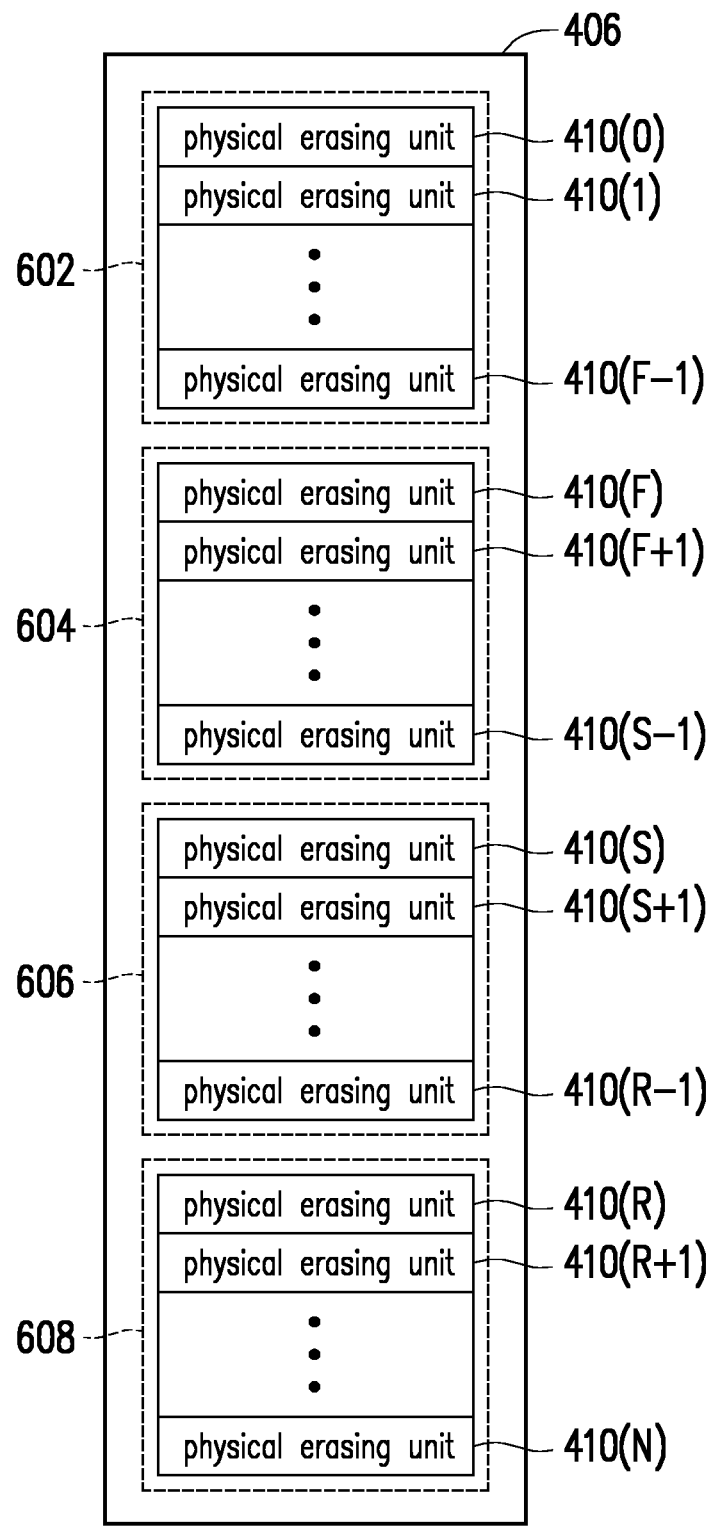
FIG. 6 and FIG. 7 are schematic diagrams of examples of managing physical erasing units according to an exemplary embodiment.
Figure 7:
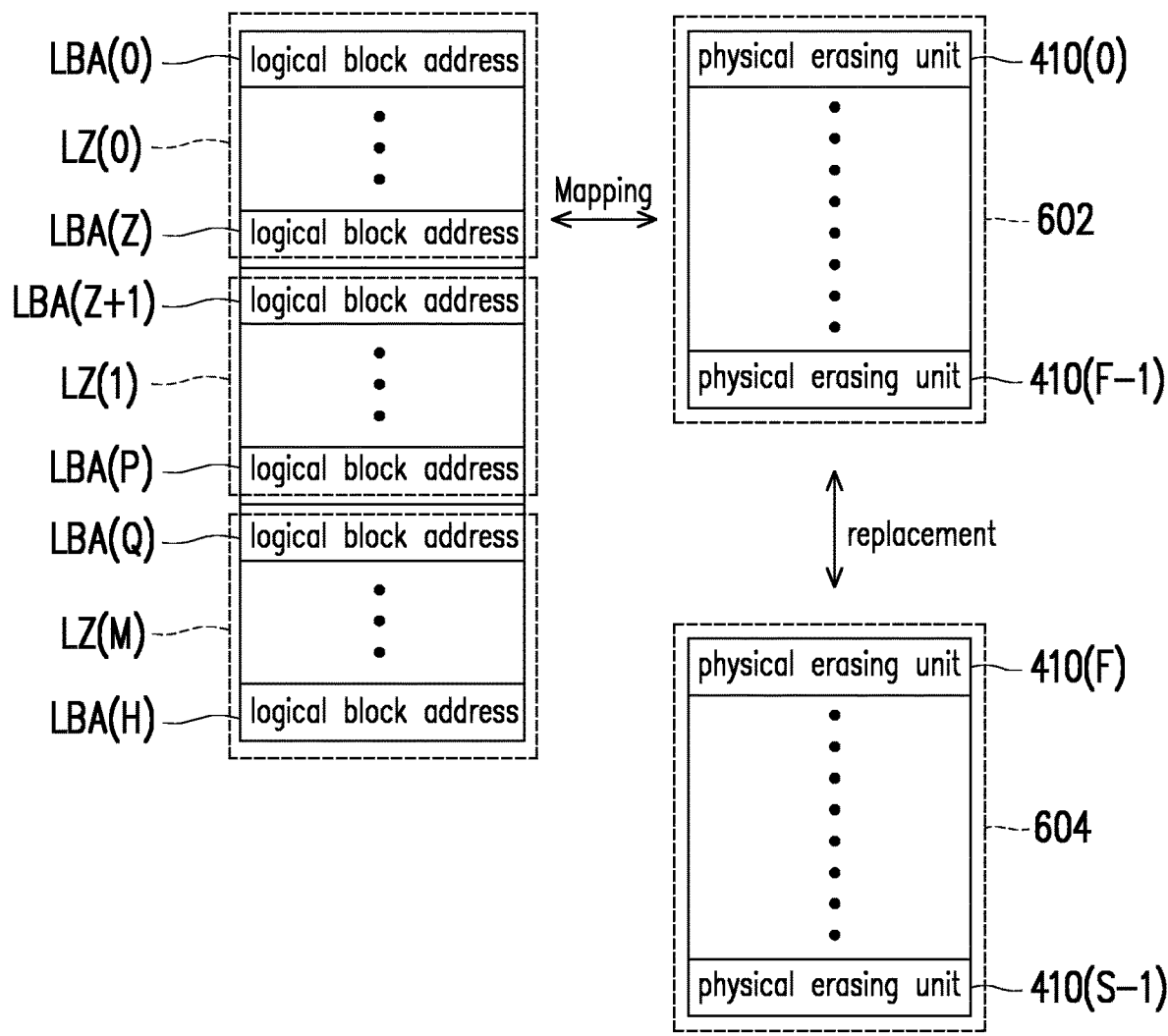

FIG. 6 and FIG. 7 are schematic diagrams of examples of managing physical erasing units according to an exemplary embodiment.

It must be understood that when describing the operation of a physical erasing unit of the rewritable non-volatile memory module 406, operating the physical erasing unit with words such as "extracting", "grouping", "dividing", and "associating" is a logical concept. In other words, the actual position of the physical erasing unit of the rewritable non-volatile memory module is not changed, but the physical erasing unit of the rewritable non-volatile memory module is logically operated.

Please refer to FIG. 6. The memory management circuit 502 logically groups the physical erasing units 410(0) to 410(N) into a data area 602, a spare area 604, a system area 606, and a replacement area 608.

The physical erasing units logically belonging to the data area 602 and the spare area 604 are configured to store data from the host system 11. Specifically, the physical erasing units of the data area 602 are regarded as physical erasing units stored with data, and the physical erasing units of the spare area 604 are configured to replace the physical erasing units of the data area 602. In other words, when receiving a write command and data to be written from the host system 11, the memory management circuit 502 writes data by using the physical erasing units extracted from the spare area 604, so as to replace the physical erasing units of the data area 602.

The physical erasing units logically belonging to the system area 606 are configured to record system data. For example, the system data includes the manufacturer and model of the rewritable non-volatile memory module, the number of physical erasing units of the rewritable non-volatile memory module, the number of physical programming units of each physical erasing unit, etc.

The physical erasing units logically belonging to the replacement area 608 are configured for the replacement procedure of bad physical erasing units to replace damaged physical erasing units. Specifically, if there are still normal physical erasing units in the replacement area 608 and the physical erasing units of the data area 602 are damaged, the memory management circuit 502 will extract the normal physical erasing units from the replacement area 608 to replace the damaged physical erasing units.

In particular, the number of physical erasing units in the data area 602, the spare area 604, the system area 606, and the replacement area 608 varies according to different memory specifications. In addition, it must be understood that during the operation of the memory storage device 10, the grouping relationship of the physical erasing units associated to the data area 602, the spare area 604, the system area 606, and the replacement area 608 dynamically changes. For example, when the physical erasing units in the spare area 604 are damaged and replaced by the physical erasing units in the replacement area 608, the original physical erasing units in the replacement area 608 are associated to the spare area 604.

Please refer to FIG. 7. The memory management circuit 502 are configured with logical block addresses LBA(0) to LBA(H) to map the physical erasing units of the data area 602. Each logical block address has multiple logical addresses to map the physical programming units of the corresponding physical erasing unit. In addition, when the host system 11 intends to write data into the logical address or update data stored in the logical address, the memory management circuit 502 extracts a physical erasing unit from the spare area 604 as an active physical erasing unit to write data, so that the physical erasing units of the data area 602 take turns. Also, when the physical erasing unit as the active physical erasing unit is fully written, the memory management circuit 502 extracts an empty physical erasing unit from the spare area 604 as the active physical erasing unit to continue writing updated data corresponding to the write command from the host system 11. In addition, when the number of available physical erasing units in the spare area 604 is less than a preset value, the memory management circuit 502 executes a garbage collection operation (also known as a valid data merge operation) to organize valid data in the data area 602, so as to re-associate the physical erasing units not stored with the valid data in the data area 602 to the spare area 604.

In order to identify which physical programming unit data of each logical address is stored in, in this exemplary embodiment, the memory management circuit 502 records the mapping relationship between the logical addresses and the physical programming units. For example, in this exemplary embodiment, the memory management circuit 502 stores a logical-to-physical mapping table in the rewritable non-volatile memory module 406 to record the physical programming unit mapped to each logical address. When data is to be accessed, the memory management circuit 502 loads the logical-to-physical mapping table to the buffer memory 508 for maintenance, and writes or reads data according to the logical-to-physical mapping table.

It is worth mentioning that due to limited capacity, the buffer memory 508 cannot store the mapping table recorded with the mapping relationship of all logical addresses. Therefore, in this exemplary embodiment, the memory management circuit 502 groups the logical block addresses LBA(0) to LBA(H) into multiple logical zones LZ(0) to LZ(M), and a logical-to-physical mapping table is configured for each logical zone. In particular, when the memory management circuit 502 intends to update the mapping of a certain logical block address, the logical-to-physical mapping table corresponding to the logical zone to which the logical block address belongs is loaded to the buffer memory 508 to be updated. Specifically, if the logical-to-physical mapping table corresponding to the logical zone to which the logical block address belongs is not temporarily stored in the buffer memory 508 (that is, when the logical-to-physical mapping table temporarily stored in the buffer memory 508 is not recorded with the mapping of the logical block address to be updated), the memory management circuit 502 executes a mapping table swapping operation to restore the logical-to-physical mapping table currently temporarily stored in the buffer memory 508 to the rewritable non-volatile memory module 406, and loads the logical-to-physical mapping table recorded with the logical block address to be updated to the buffer memory 508.

In another exemplary embodiment of the disclosure, the control commands of the memory management circuit 502 may also be stored in a specific region (for example, a system area dedicated to storing system data in the memory module) of the rewritable non-volatile memory module 406 in a program code form. In addition, the memory management circuit 502 has a microprocessor unit (not shown), a read only memory (not shown), and a random access memory (not shown). In particular, the read only memory has a boot code, and when the memory control circuit unit 404 is enabled, the microprocessor unit first executes the boot code to load the control commands stored in the rewritable non-volatile memory module 406 to the random access memory of the memory management circuit 502. After that, the microprocessor unit runs the control commands to perform operations such as data writing, reading, and erasing.

In addition, in another exemplary embodiment of the disclosure, the control commands of the memory management circuit 502 may also be implemented in a hardware form. For example, the memory management circuit 502 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is configured to manage the physical erasing units of the rewritable non-volatile memory module 406. The memory writing circuit is configured to issue a write command to the rewritable non-volatile memory module 406 to write data into the rewritable non-volatile memory module 406. The memory reading circuit is configured to issue a read command to the rewritable non-volatile memory module 406 to read data from the rewritable non-volatile memory module 406. The memory erasing circuit is configured to issue an erase command to the rewritable non-volatile memory module 406 to erase data from the rewritable non-volatile memory module 406. The data processing circuit is configured to process data to be written into the rewritable non-volatile memory module 406 and data read from the rewritable non-volatile memory module 406.

Please refer to FIG. 5 again. The host interface 504 is coupled to the memory management circuit 502 and is configured to couple to the connection interface unit 402 to receive and identify commands and data sent by the host system 11. In other words, the commands and data sent by the host system 11 are sent to the memory management circuit 502 through the host interface 504. In this exemplary embodiment, the host interface 504 is compatible with the SATA standard. However, it must be understood that the disclosure is not limited thereto. The host interface 504 may also be compatible with the PATA standard, the IEEE 1394 standard, the PCI express standard, the USB standard, the UHS-I interface standard, the UHS-II interface standard, the SD interface standard, the MS interface standard, the MMC interface standard, the CF interface standard, the IDE interface standard, or other suitable data transmission standards.

The memory interface 506 is coupled to the memory management circuit 502 and is configured to access the rewritable non-volatile memory module 406. In other words, data to be written into the rewritable non-volatile memory module 406 is converted into a format acceptable by the rewritable non-volatile memory module 406 via the memory interface 506.

The buffer memory 508 is coupled to the memory management circuit 502 and is configured to temporarily store temporary data and commands from the host system 11 or data from the rewritable non-volatile memory module 406.

The power management circuit 510 is coupled to the memory management circuit 502 and is configured to control the power of the memory storage device 10.

The error checking and correcting circuit 512 is coupled to the memory management circuit 502 and is configured to execute an error checking and correcting procedure to ensure the correctness of data. For example, when the memory management circuit 502 receives a write command from the host system 11, the error checking and correcting circuit 512 generates a corresponding error checking and correcting code (ECC code) for data corresponding to the write command, and the memory management circuit 502 writes the data corresponding to the write command and the corresponding ECC code into the rewritable non-volatile memory module 406. After that, when the memory management circuit 502 reads data from the rewritable non-volatile memory module 406, the ECC code corresponding to the data is read at the same time, and the error checking and correcting circuit 512 executes the error checking and correcting procedure on the read data according to the ECC code.

Figure 8:
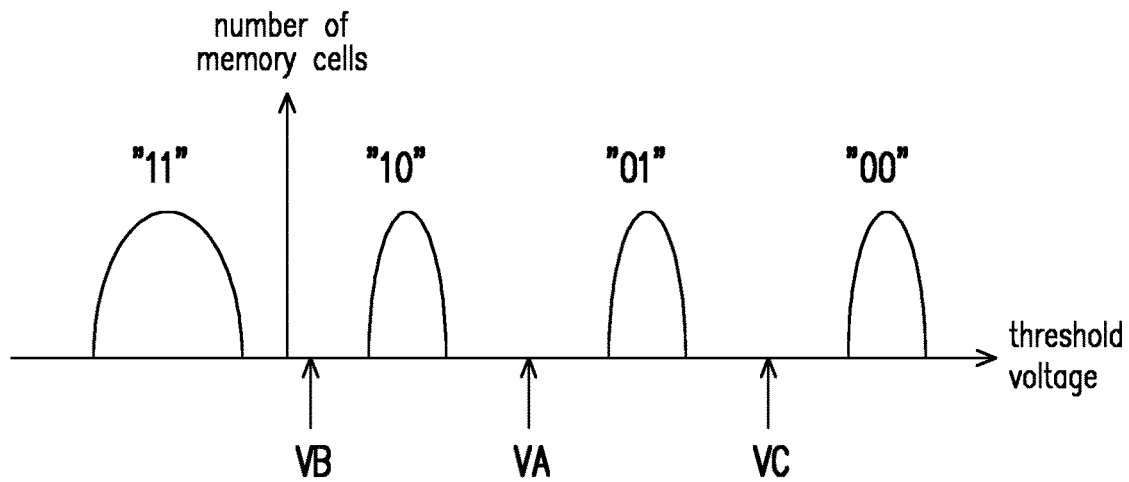
FIG. 8 is a schematic diagram of threshold voltage distributions of memory cells according to an exemplary embodiment.
Figure 9:
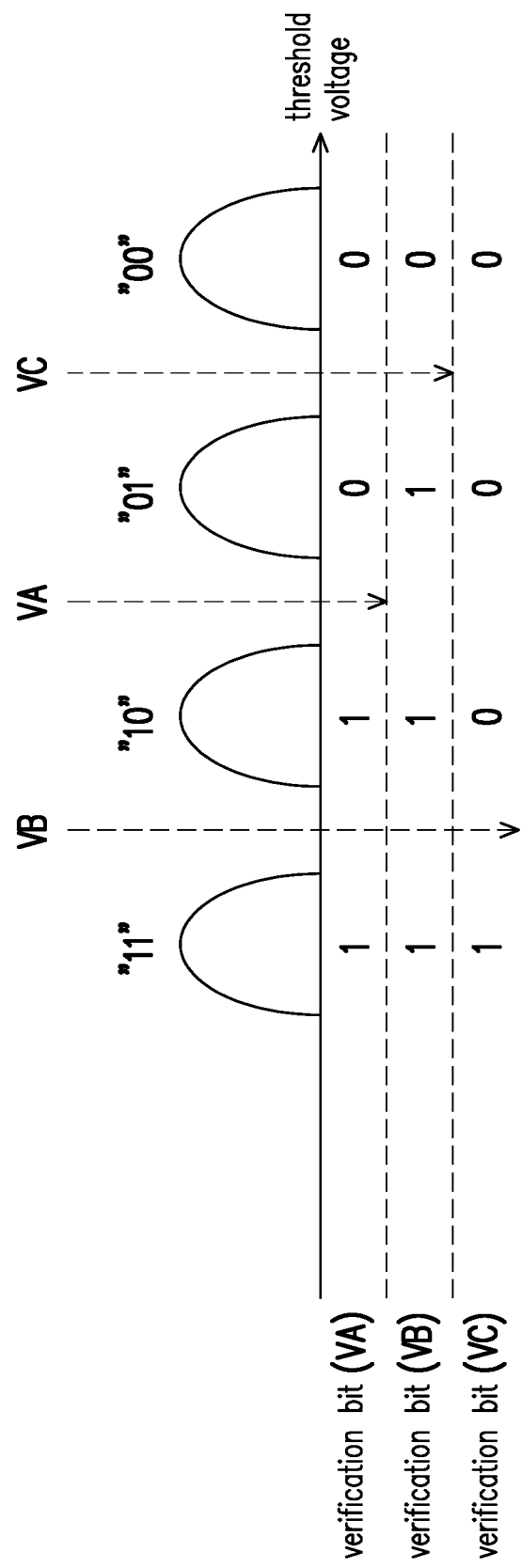
FIG. 9 is a schematic diagram of reading data from memory cells according to an exemplary embodiment.

FIG. 8 is a schematic diagram of threshold voltage distributions of memory cells according to an exemplary embodiment. FIG. 9 is a schematic diagram of reading data from memory cells according to an exemplary embodiment. Please refer to FIG. 8 and FIG. 9. The MLC NAND flash memory is taken as an example. Based on different threshold voltages, each memory cell has 4 storage states, and the storage states respectively represent "11", "10", "01", "00", and other bits. In other words, each storage state includes a least significant bit (LSB) and a most significant bit (MSB). In this exemplary embodiment, the 1-st bit from the left in each storage state is the LSB, and the 2-nd bit from the left is the MSB. Therefore, in this exemplary embodiment, each memory cell may store 2 bits. It must be understood that the correspondence between the threshold voltage and the storage state thereof shown in FIG. 8 is only an example. In another exemplary embodiment, the correspondence between the threshold voltage and the storage state may also be arranged in "11", "10", "00", and "01" or other arrangements as the threshold voltage increases. In addition, in another exemplary embodiment, it is also possible to define the 1-st bit from the left as the MSB, and the 2-nd bit from the left as the LSB.

A read operation of a memory cell is to identify data stored in the memory cell by applying a read voltage to a control gate and by a conduction state of a memory cell channel. The MLC NAND flash memory is taken as an example. A verification bit (VA) is configured to indicate whether a memory cell channel is conducted when a read voltage VA is applied. A verification bit (VB) is configured to indicate whether a memory cell channel is conducted when a read voltage VB is applied. A verification bit (VC) is configured to indicate whether a memory cell channel is conducted when a read voltage VC is applied. It is assumed here that when the verification bit is "1", it represents that the corresponding memory cell channel is conducted, and when the verification bit is "0", it represents that the corresponding memory cell channel is not conducted. As shown in FIG. 9, it is possible to judge which storage state the memory cell is in through the verification bits (VA) to (VC), thereby obtaining the stored bits.

Figure 10:
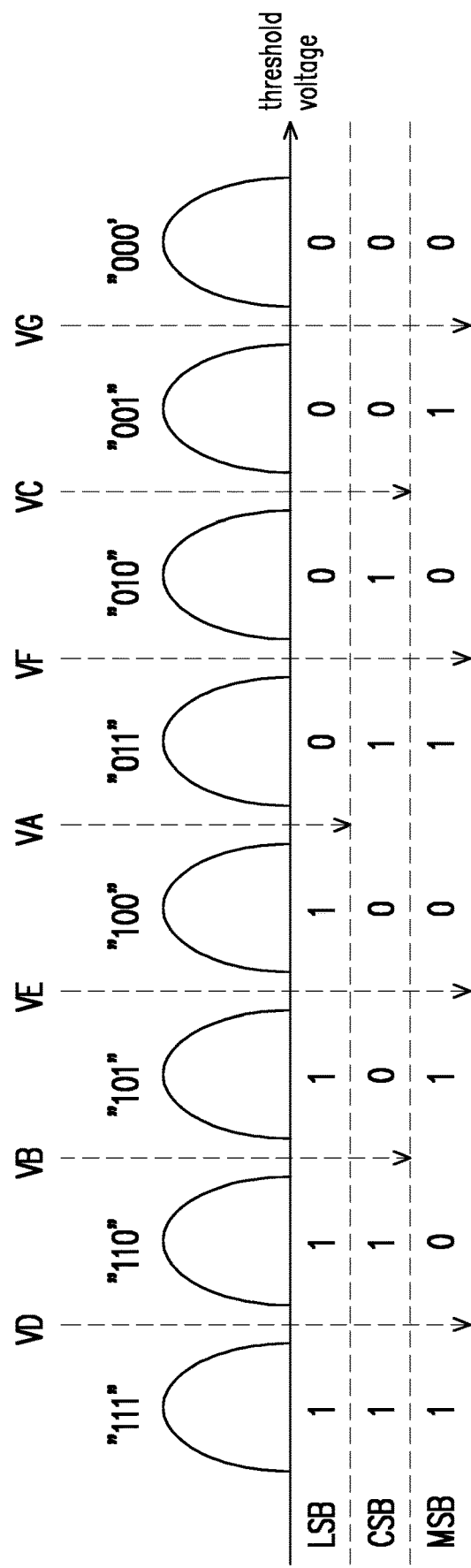
FIG. 10 is a schematic diagram of reading data from memory cells according to another exemplary embodiment.

FIG. 10 is a schematic diagram of reading data from memory cells according to another exemplary embodiment. Please refer to FIG. 10. The TLC NAND flash memory is taken as an example. Each storage state represents 3 bits stored in a memory cell. For example, in this exemplary embodiment, each storage state includes the LSB of the 1-st bit from the left, a center significant bit (CSB) of the 2-nd bit from the left, and the MSB of the 3-rd bit from the left. In this exemplary embodiment, according to different threshold voltages, the memory cells have 8 storage states (that is, "111", "110", "101", "100", "011", "010", "001", and "000"). By applying the read voltages VA to VG to the control gates, the bits stored in the memory cells may be identified. It is worth noting that the arrangement order of the 8 storage states may be customized according to the design of the manufacturer, which is not limited by the disclosure. In addition, in another exemplary embodiment, a certain bit in the 3 bits stored in a memory cell may be the LSB, the CSB, or the MSB, which may be adjusted according to practical requirements.

It should be noted that for the convenience of description, in the following exemplary embodiment, if a certain memory cell may store 2 bits, it is assumed that the 1-st bit from the left in the 2 bits is the LSB and belongs to a lower physical programming unit, and the 2-nd bit from the left is the MSB and belongs to an upper physical programming unit. In addition, if a certain memory cell may store 3 bits, it is assumed that the 1-st bit from the left in the 3 bits is the LSB and belongs to the lower physical programming unit, the 2-nd bit from the left is the CSB and belongs to a middle physical programming unit, and the 3-rd bit from the left is the MSB and belongs to the upper physical programming unit.

When the memory management circuit 502 reads n data bits (to form a codeword) from the rewritable non-volatile memory module 406, the memory management circuit 502 also obtains reliability information (also known as channel reliability information) of each data bit. The reliability information is configured to represent the probability (or the confidence) of the corresponding data bit being decoded as a bit "1" or "0". The error checking and correcting circuit 512 performs a decoding operation according to the reliability information. For example, the decoding operation includes an iterative decoding operation.

A low-density parity-check (LDPC) code is taken as an example. In the low-density parity-check code, a parity check matrix is used to define a valid codeword. The codeword includes a message bit and a parity bit. Hereinafter, the message bit and the parity bit are collectively known as the data bit. Generally speaking, the parity check matrix may be expressed as a bipartite graph, which includes a parity node and a message node. Each parity node corresponds to a syndrome, and each message node corresponds to a data bit. The correspondence between the data bit and the syndrome (that is, the connection between the message node and the parity node) is generated according to the parity check matrix. Specifically, if an element in the i-th row and the j-th column of the parity check matrix is 1, the i-th parity node will be connected to the j-th message node, where i and j are positive integers.

When the memory management circuit 502 reads n data bits (to form a codeword) from the rewritable non-volatile memory module 406, in the bipartite graph, the message node also receives the corresponding reliability information. The error checking and correcting circuit 512 executes the decoding operation according to the structure of the bipartite graph and the reliability information. For example, the decoding operation includes the iterative decoding operation. In the iterative decoding operation, the message node calculates the reliability information for the parity node, and the parity node also calculates the reliability information for the message node. The reliability information is sent along edges in the bipartite graphs. The reliability information is used to represent the probability (that is, the confidence) of a node deeming that a certain data bit is decoded as "1" or "0". In addition, the reliability information of the message node and the parity node is used to calculate the output reliability information, which is similar to calculating the conditional probability of a data bit being decoded as "1" or "0". Therefore, the above process of sending the reliability information is also known as belief propagation.

Based on different algorithms, the message node and/or the parity node will calculate different reliability information. For example, the error checking and correcting circuit 512 may adopt algorithms such as sum-product algorithm, min-sum algorithm, or bit-flipping algorithm, which is not limited by the disclosure.

In each iteration of the iterative decoding operation, the message node sends the reliability information to the parity node, and the parity node also sends the reliability information to the message node. After each iteration, the message node calculates whether each data bit should be decoded as bit "1" or "0" according to the current reliability information. After executing a parity check procedure (for example, multiplying the codeword formed by the data bits with the parity check matrix) on the calculated data bits, it may be judged whether the codeword is a valid codeword. If the generated codeword is a valid codeword, it represents that decoding is successful and the iterative decoding operation will stop. However, if the generated codeword is not a valid codeword, the next iteration will be performed. If the number of iterations of the iterative decoding operation reaches a preset value, it represents that decoding has failed and the iterative decoding operation will also stop.

In an exemplary embodiment, the reliability information includes a log likelihood ratio (LLR). Generally speaking, the larger the absolute value of the log likelihood ratio (which may be positive or negative) of a certain data bit, the higher the reliability of the data bit. Therefore, the current bit value of the data bit has a higher probability to be regarded as correct. Conversely, the smaller the absolute value of the log likelihood ratio of a certain data bit, the lower the reliability of the data bit. Therefore, the current bit value of the data bit has a higher probability to be regarded as wrong and corrected during the current iterative decoding operation. In an exemplary embodiment, the reliability information (for example, the log likelihood ratio) used in the iterative decoding operation is obtained by looking up a table. Then, in another exemplary embodiment, the reliability information used in the iterative decoding operation may also be dynamically calculated and generated according to a specific algorithm in the iterative decoding operation.

In a programming operation of the rewritable non-volatile memory module 406 on the memory cells, if the data to be programmed (that is, the data to be stored) is correct, the threshold voltage of a programmed memory cell may slightly deviate due to different degree of depletion of different memory cells. Affected by the deviation, data subsequently read from the memory cell may have errors. Generally speaking, there is a high probability that such errors may be corrected by the decoding operation executed by the error checking and correcting circuit 512. For example, the error checking and correcting circuit 512 may effectively correct the errors by slightly adjusting a read voltage level for reading the memory cell or executing the iterative decoding operation multiple times.

Figure 11:
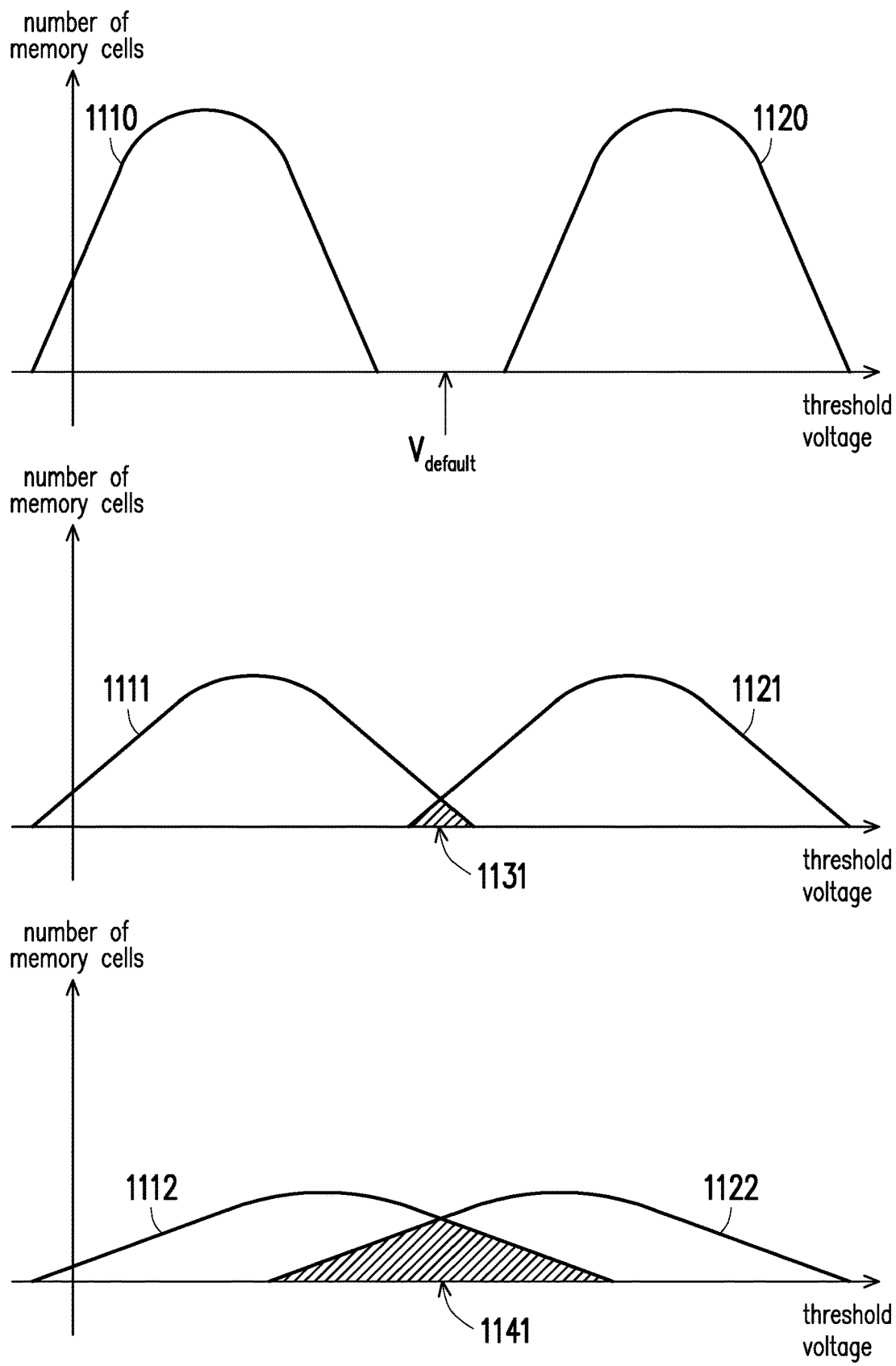
FIG. 11 is a schematic diagram of changes in threshold voltage distributions of memory cells according to an exemplary embodiment.

FIG. 11 is a schematic diagram of changes in threshold voltage distributions of memory cells according to an exemplary embodiment. Please refer to FIG. 11. It is assumed that at the beginning, the degree of depletion of multiple memory cells in the rewritable non-volatile memory module 406 is very low (for example, the program/erase cycle (P/E) count of the memory cells is very small). Therefore, after programming the memory cells in the rewritable non-volatile memory module 406, it is assumed that the threshold voltage distribution of a part of the memory cells whose storage state is in an erased state is a distribution 1110, and the threshold voltage distribution of another part of the memory cells whose storage state is in a programmed state is a distribution 1120. In order to read data stored in at least one of the memory cells, the memory management circuit 502 sends a read command sequence to the rewritable non-volatile memory module 406. According to the read command sequence, the rewritable non-volatile memory module 406 reads the memory cells and sends obtained data bits to the memory management circuit 502 by using a (default) read voltage level $V_{default}$. Each memory cell storing one bit of bit data is taken as an example. If the threshold voltage of a certain memory cell is less than the read voltage level $V_{default}$ (for example, a memory cell whose threshold voltage belongs to the distribution 1110), the memory management circuit 502 may read bit "1". Alternatively, if the threshold voltage of a certain memory cell is greater than the read voltage level $V_{default}$ (for example, a memory cell whose threshold voltage belongs to the distribution 1120), the memory management circuit 502 may read bit "0".

However, as the usage time of the rewritable non-volatile memory module 406 increases (for example, the P/E count increases) and/or the operating environment changes, the memory cells in the rewritable non-volatile memory module 406 may experience performance degradation. For example, after the memory cells belonging to the distributions 1110 and 1120 experience performance degradation, the distributions 1110 and 1120 may gradually approach each other or even overlap with each other. For example, distributions 1111 and 1121 are configured to respectively represent the distributions 1110 and 1120 after performance degradation. Compared with the distributions 1110 and 1120, the distributions 1111 and 1121 contain an overlap region 1131 (represented by slashes).

After performance degradation, if the same read voltage level $V_{default}$ is continued to be used to read the memory cells, the read data bits may contain many errors. For example, the errors include misjudging the memory cells belonging to the distribution 1111 as belonging to the distribution 1121 and/or misjudging the memory cells belonging to the distribution 1121 as belonging to the distribution 1111. In an exemplary embodiment, the error checking and correcting circuit 508 executes a preset decoding operation (also known as a first preset decoding operation) according to the obtained data bits, so as to try to quickly correct errors in the data bits. In an exemplary embodiment, the first preset decoding operation is also known as a hard-bit mode decoding operation, and the hard-bit mode decoding operation is configured to decode read hard bits.

Figure 12:
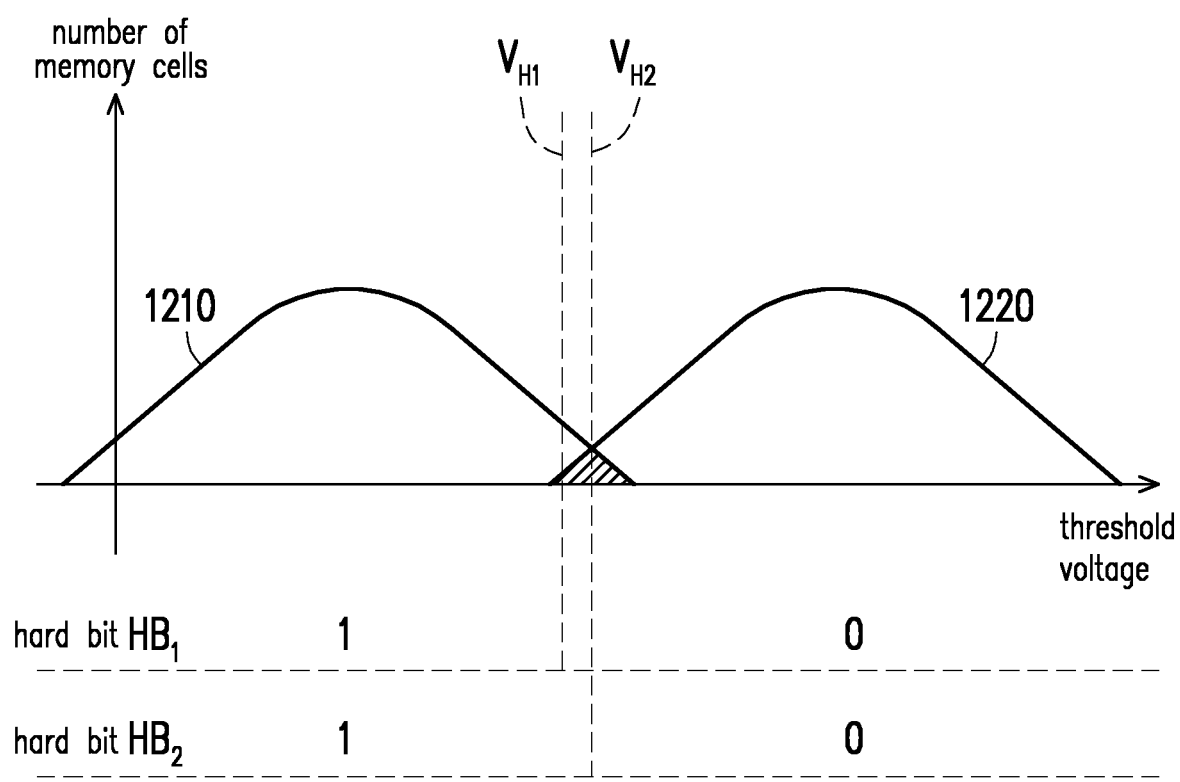
FIG. 12 is a schematic diagram of a hard-bit mode decoding operation according to an exemplary embodiment.

FIG. 12 is a schematic diagram of a hard-bit mode decoding operation according to an exemplary embodiment. Please refer to FIG. 12. It is assumed that the threshold voltage distribution of a part of the memory cells whose storage state is in the erased state in the rewritable non-volatile memory module 406 is a distribution 1210, and the threshold voltage distribution of another part of the memory cells whose storage state is in the programmed state is a distribution 1220. When data stored in the memory cells is to be read, the memory management circuit 502 sends a read command sequence (also known as a hard decision read command sequence) to the rewritable non-volatile memory module 406. According to the hard decision read command sequence, the rewritable non-volatile memory module 406 reads the memory cells and sends obtained data bits (for example, hard bits $HB_1$) to the memory management circuit 502 by using a hard decision read voltage level (for example, a read voltage level $V_{H1}$).

The error checking and correcting circuit 512 executes the hard-bit mode decoding operation according to the obtained hard bits $H_{B1}$ to try to correct possible errors in the hard bits $H_{B1}$. If all the errors are corrected, it represents that decoding is successful, and the error checking and correcting circuit 512 will output successful decoded bits. If the errors are not fully corrected, it represents that decoding has failed, and the memory management circuit 502 will adjust the hard decision read voltage level (for example, adjust the hard decision read voltage level from the read voltage level $V_{H1}$ to a read voltage Level $V_{H2}$) and send another hard decision read command sequence to the rewritable non-volatile memory module 406. According to the hard decision read command sequence, the rewritable non-volatile memory module 406 reads the memory cells again and sends obtained data bits (for example, hard bits $HB_2$) to the memory management circuit 502 by using the read voltage level $V_{H2}$.

The error checking and correcting circuit 512 executes the hard-bit mode decoding operation again according to the obtained hard bits $HB_2$ to try to correct possible errors in the hard bits $HB_2$. If all the errors are corrected, it represents that decoding is successful, and the error checking and correcting circuit 512 will output successful decoded bits. In addition, if the errors are not fully corrected, the memory management circuit 502 may adjust the hard decision read voltage level for reading the memory cells again, and more hard-bit mode decoding operations may be executed.

Please return to FIG. 11. For the memory cells whose threshold voltages belong to the distributions 1111 and 1121, if the memory cells are used continuously, the memory cells may continuously experience performance degradation. For example, the distributions 1111 and 1121 may be further changed to distributions 1112 and 1122. For example, the distributions 1112 and 1122 contain an overlap region 1141 (represented by slashes). The area of the overlap region 1141 is greater than the area of the overlap region 1131. Alternatively, the total number of memory cells whose threshold voltages belong to the overlap region 1141 is more than the total number of memory cells whose threshold voltages belong to the overlap region 1131. At this time, limited by the decoding ability (or error correcting ability) of the hard-bit mode decoding operation, even if more hard decision read voltage levels are used to read the memory cells and hard decoding procedures are correspondingly executed more times, it still may not be possible to correct all the errors by single reading of the hard bits.

In an exemplary embodiment, for the memory cells whose threshold voltages belong to the distributions 1112 and 1122 (or similar distributions), the error checking and correcting circuit 512 executes another preset decoding operation (also known as a second default decoding operation) according to obtained data bits, so as to try to use more information to debug errors. In an exemplary embodiment, the second preset decoding operation is also known as a soft-bit mode decoding operation, and the soft-bit mode decoding operation is configured to decode read soft bits.

Figure 13:
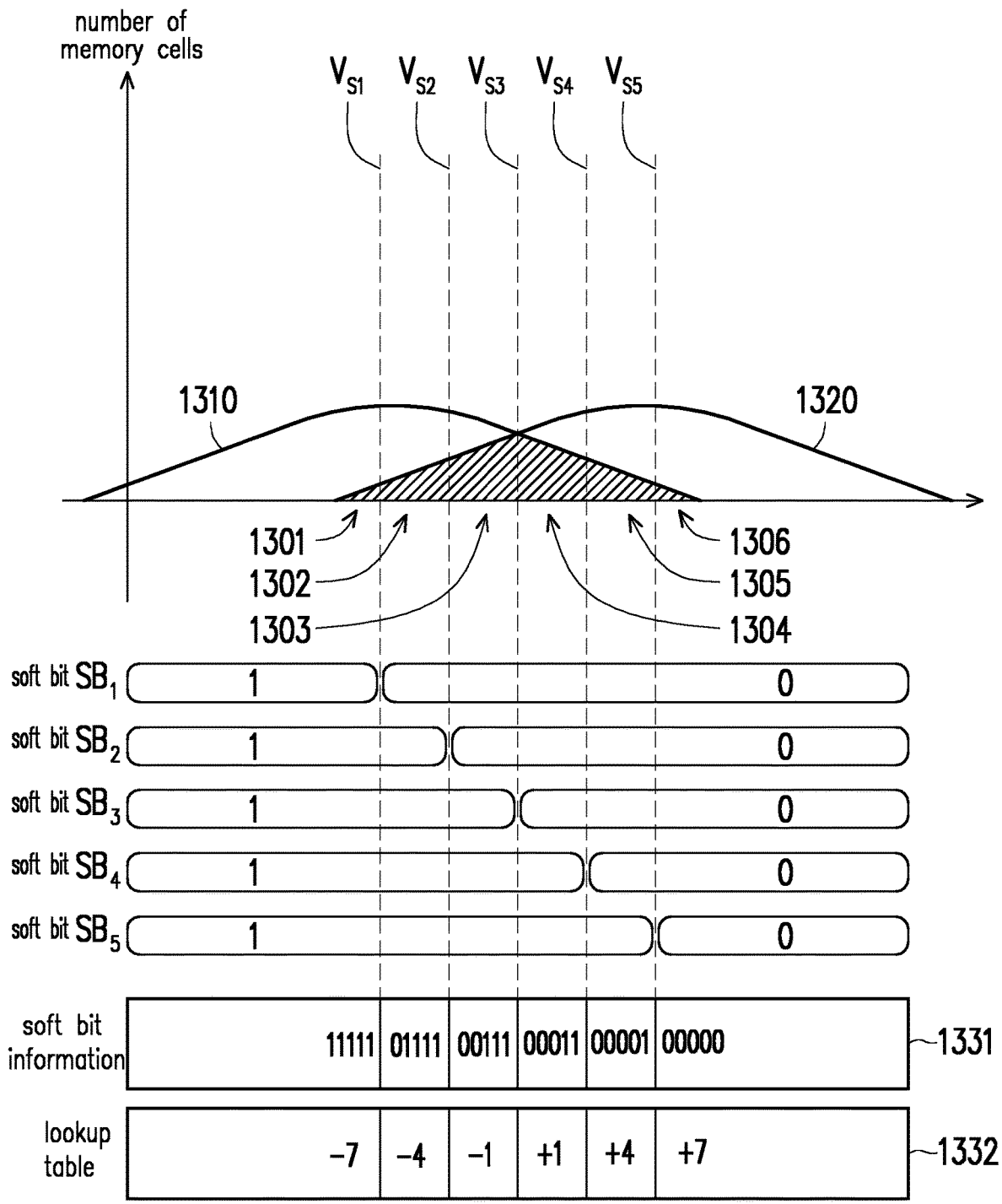
FIG. 13 is a schematic diagram of a soft-bit mode decoding operation according to an exemplary embodiment.

FIG. 13 is a schematic diagram of a soft-bit mode decoding operation according to an exemplary embodiment. Please refer to FIG. 13. The memory management circuit 502 sends a read command sequence (also known as a soft decision read command sequence) to the rewritable non-volatile memory module 406. According to the soft decision read command sequence, the rewritable non-volatile memory module 406 reads the memory cells and sends obtained data bits (for example, soft bit information 1331) to the memory management circuit 502 by using multiple read voltage levels $V_{S1}$ to $V_{S5}$ (also known as soft decision read voltage levels). The obtained soft bit information 1331 contains multiple soft bits $S_{B1}$ to $S_{B5}$ read from a certain memory cell. In addition, the soft bit information 1331 may also be used to judge which voltage interval 1301 to 1306 in FIG. 13 the threshold voltage of a certain memory cell belongs to.

In an exemplary embodiment of FIG. 13, one of the read voltage levels $V_{S1}$ to $V_{S5}$ is set as a sign read voltage level. The sign read voltage level is used to determine the bit value of a data bit. For example, if the read voltage level $V_{S3}$ is a sign read voltage, the bit value of the data bit will be the same as the bit value of the soft bit $SB_3$; if the read voltage level $V_{S2}$ is the sign read voltage, the bit value of the data bit will be the same as the bit value of the soft bit $SB_2$, and so on.

In an exemplary embodiment, the error checking and correcting circuit 512 obtains the reliability information of a certain data bit according to the soft bit information corresponding to the data bit. For example, in an exemplary embodiment of FIG. 13, if the soft bit information corresponding to a certain data bit is "11111", the error checking and correcting circuit 512 will query a lookup table according to the soft bit information to obtain a log likelihood ratio corresponding to the voltage interval 1301. The log likelihood ratio will be regarded as the reliability information of the data bit. For example, the error checking and correcting circuit 512 may query a lookup table 1332 according to soft bit information 1331 to obtain a log likelihood ratio −7 corresponding to the voltage interval 1301.

Then, the error checking and correcting circuit 512 executes the soft-bit mode decoding operation according to the data bit and the reliability information of the data bit. In addition, the reliability information of the data bit may also be updated at least once by querying other lookup tables or being dynamically generated in the soft-bit mode decoding operation. For the details of the soft-bit mode decoding operation, please refer to the foregoing embodiment of executing the decoding operation according to the structure of the bipartite graph and the reliability information, which will not be repeated here.

It should be noted that according to the description of the hard-bit mode decoding operation and the soft-bit mode decoding operation, it can be seen that if the errors in the data bit are generated merely due to slight deviation of the threshold voltage of the memory cell (for example, present in the overlap region 1131 or 1141 in FIG. 11), the error checking and correcting circuit 512 may effectively correct the errors by executing the hard-bit mode decoding operation or the soft-bit mode decoding operation. FIG. 13 is taken as an example. The closer the threshold voltage of a memory cell corresponding to a certain data bit to the V-shaped region between distributions 1310 and 1320 (for example, located in the voltage interval 1303 or 1304), the smaller the absolute value of the log likelihood ratio allocated to the data bit. Conversely, the further the threshold voltage of a memory cell corresponding to a certain data bit from the V-shaped region between the distributions 1310 and 1320 (for example, in the voltage interval 1301 or 1306), the larger the absolute value of the logarithmic possibility ratio allocated to the data bit.

Figure 14A:
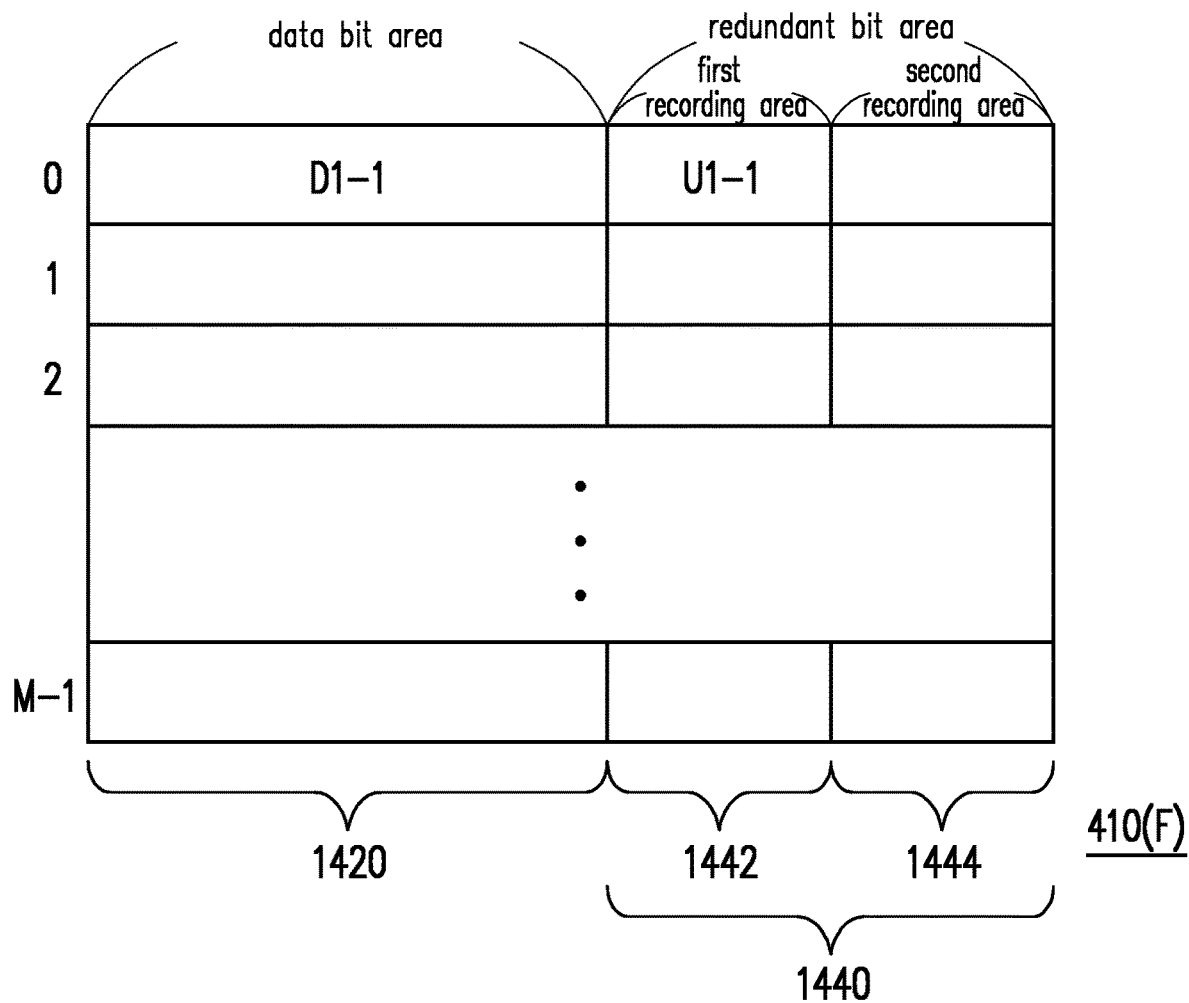
FIG. 14A and FIG. 14B are an example of writing write data and dummy data corresponding to the write data into a physical programming unit according to an exemplary embodiment.
Figure 14B:
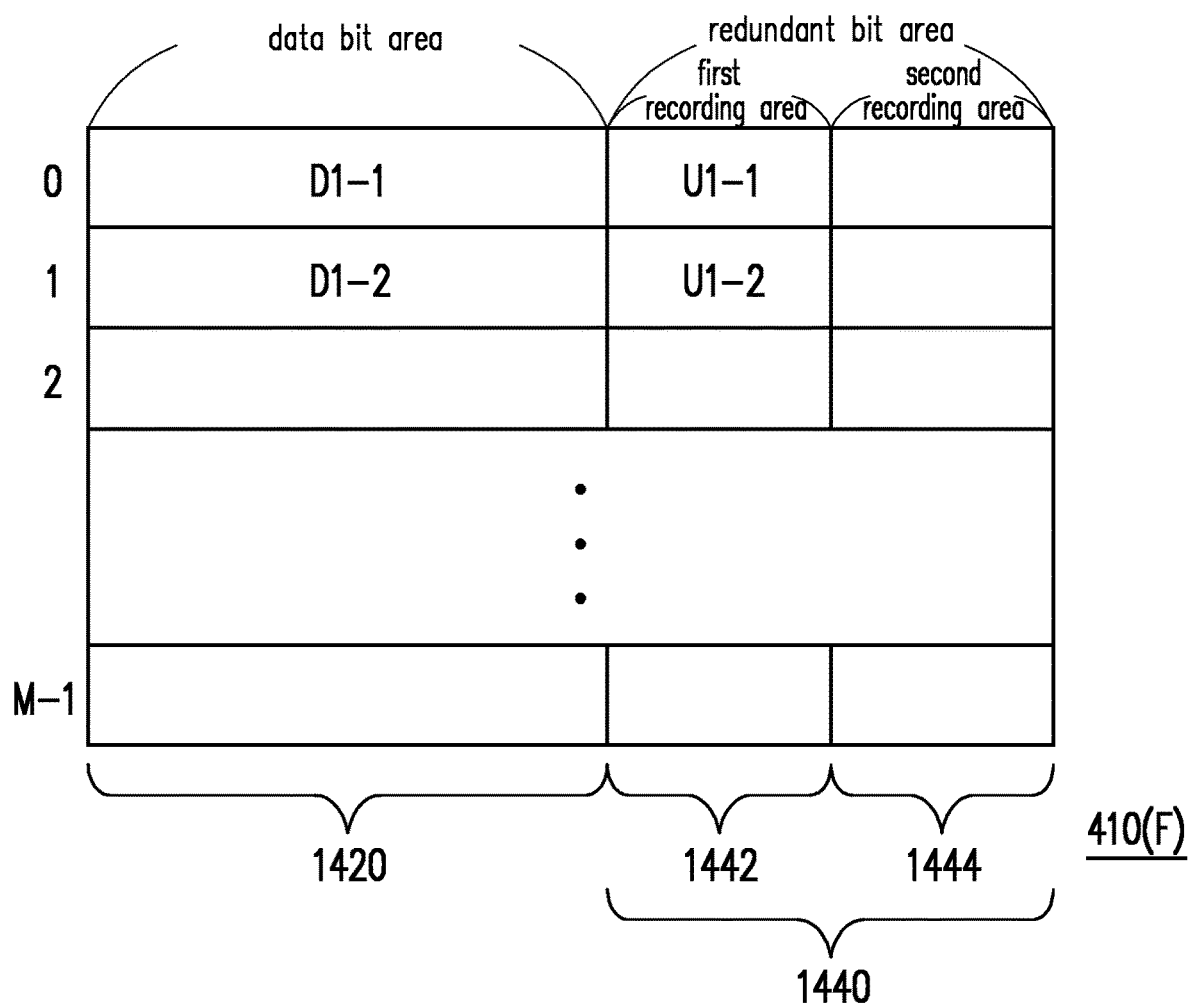

FIG. 14A and FIG. 14B are an example of writing write data and dummy data corresponding to the write data into a physical programming unit according to an exemplary embodiment.

Please refer to FIG. 14A. In this exemplary embodiment, each physical programming unit includes a data bit area 1420 and a redundant bit area 1440. The redundant bit area may include one or more recording areas. For example, the redundant bit area 1440 of this exemplary embodiment includes a first recording area 1442 and a second recording area 1444.

In this exemplary embodiment, when the host system 11 sends a write command and data D1-1 corresponding to the write command to the memory storage device 10, the memory management circuit 502 generates dummy data corresponding to the data D1-1. For example, the dummy data may be data whose bits are all "1", which is not limited by the disclosure.

As shown in FIG. 14A, the memory management circuit 502 generates dummy data U1-1 corresponding to the data D1-1, and extracts the physical erasing unit 410(F) from the spare area 604 as the active physical erasing unit. After that, the memory management circuit 502 sequentially writes the data D1-1 and the dummy data U1-1 corresponding to the data D1-1 into the 0-th physical programming unit of the physical erasing unit 410(F). In other words, the data D1-1 is programmed into the data bit area 1420 of the 0-th physical programming unit of the physical erasing unit 410(F), and the dummy data U1-1 is programmed into the first recording area 1442 of the redundant bit area 1440. In addition, the second recording area 1444 may be written with other data corresponding to the data D1-1. For example, the error checking and correcting code, the good/bad labelling of the physical programming unit, etc. are not limited by the disclosure.

Please refer to FIG. 14B. When the host system 11 sends another write command and data D1-2 corresponding to the write command to the memory storage device 10, the memory management circuit 502 generates dummy data U1-2 corresponding to the data D1-2. Here, the memory management circuit 502 sequentially writes the data D1-2 and the dummy data U1-2 corresponding to the data D1-2 into the 1-st physical programming unit of the physical erasing unit 410(F). In other words, the data D1-2 is programmed into the data bit area 1420 of the 1-st physical programming unit of the physical erasing unit 410(F), and the dummy data U1-2 is programmed into the first recording area 1442 of the redundant bit area 1440.

In this exemplary embodiment, when the host system 11 intends to read the data D1-1 from the memory storage device 10, the memory management circuit 502 reads multiple data bits from the 0-th physical programming unit of the physical erasing unit 410(F) written with the data D1-1 to form a codeword. In addition, the error checking and correcting circuit 512 executes a decoding operation on the codeword. The decoding operation includes an iterative decoding operation. Specifically, the memory management circuit 502 sends the codeword to be decoded to the error checking and correcting circuit 512 to perform the corresponding iterative decoding operation, thereby decoding the data D1-1 corresponding to the codeword. When receiving the codeword, the error checking and correcting circuit 512 performs the iterative decoding operation on the received codeword to identify the data bits of the received codeword. In an exemplary embodiment, the decoding operation may include a hard-bit mode decoding operation and a soft-bit mode decoding operation.

Next, the error checking and correcting circuit 512 judges whether the decoding operation is successful. As mentioned above, if the codeword generated by the iterative decoding operation is a valid codeword, it represents that decoding is successful and the iterative decoding operation will stop. However, if the generated codeword is not a valid codeword, the next iteration will be performed. If the number of iterations of the iterative decoding operation reaches a preset value, it represents that decoding has failed. The preset value may be set by the manufacturer, which is not limited by the disclosure. It should be noted that the failure of the decoding operation described in this exemplary embodiment may be a case where the hard-bit mode decoding operation fails, the soft-bit mode decoding operation fails, or both fail, which is not limited by the disclosure.

In this exemplary embodiment, if it is judged that the decoding operation has failed, the memory management circuit 502 will obtain the dummy data U1-1 of the first recording area 1442 in the 0-th physical programming unit of the physical erasing unit 410(F) written with the data D1-1 from the codeword. Next, the memory management circuit 502 calculates a bit change ratio of a bit value change in the obtained dummy data U1-1, and adjusts a decoding parameter according to the bit change ratio. The decoding parameter may be any parameter, including but not limited to a read voltage level or a log likelihood ratio, used in the decoding operation, which is not limited by the disclosure.

Figures 15A, 15B, 15C:
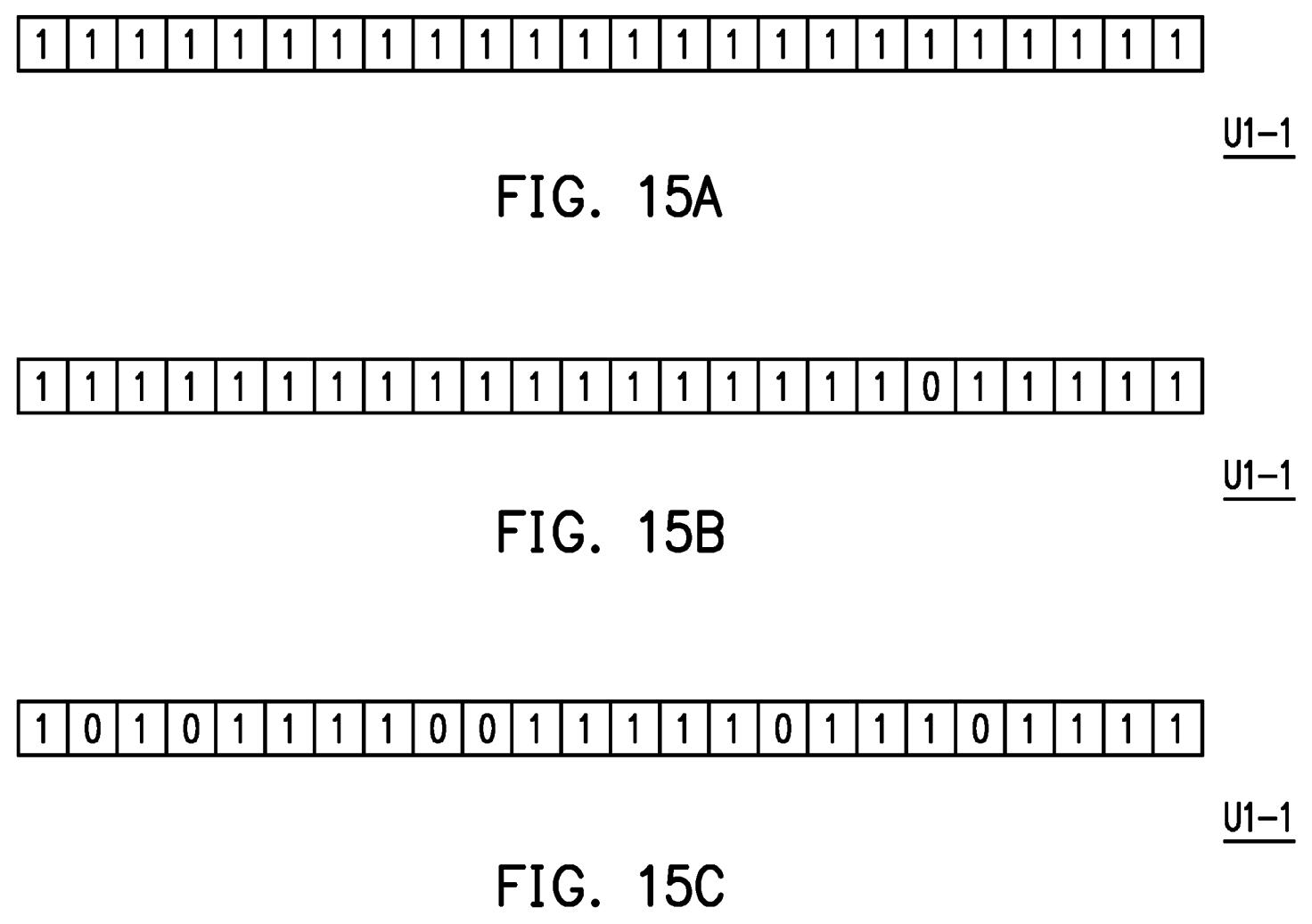

FIG. 15A to FIG. 15C are an example of dummy data according to an exemplary embodiment. Please refer to FIG. 15A. It is assumed that bits of the dummy data U1-1 corresponding to the data D1-1 are all "1" when storing data. Over time, the memory cell storing the dummy data U1-1 may be depleted, which causes the threshold voltage of the memory cell to deviate, resulting in errors in the dummy data U1-1. As shown in FIG. 15B, a part/all of the data bits in the dummy data U1-1 read by the memory management circuit 502 include bit "0", which represents the deviation of the current threshold voltage. Here, the memory management circuit 502 may calculate the bit change ratio of bit "1" changing to "0" (for example, the bit change ratio of bit "0" in FIG. 15B is 1/24) in the read dummy data U1-1. As shown in FIG. 15C, there are 6 data bits including bit "0" in the dummy data U1-1 read by the memory management circuit 502, which represents that the deviation of the current threshold voltage is more serious. Here, the memory management circuit 502 may calculate that the bit change ratio of bit "1" changing to "0" in the read dummy data U1-1 is 6/24.

In an exemplary embodiment, the memory management circuit 502 may determine a compensation value according to the bit change ratio, and adjust the decoding parameter to a new decoding parameter according to the compensation value. For example, the memory management circuit 502 queries a lookup table according to the bit change ratio to obtain the compensation value. In addition, the memory management circuit 502 may also calculate the compensation value corresponding to the bit change ratio according to an equation, which is not limited by the disclosure.

Figure 16:
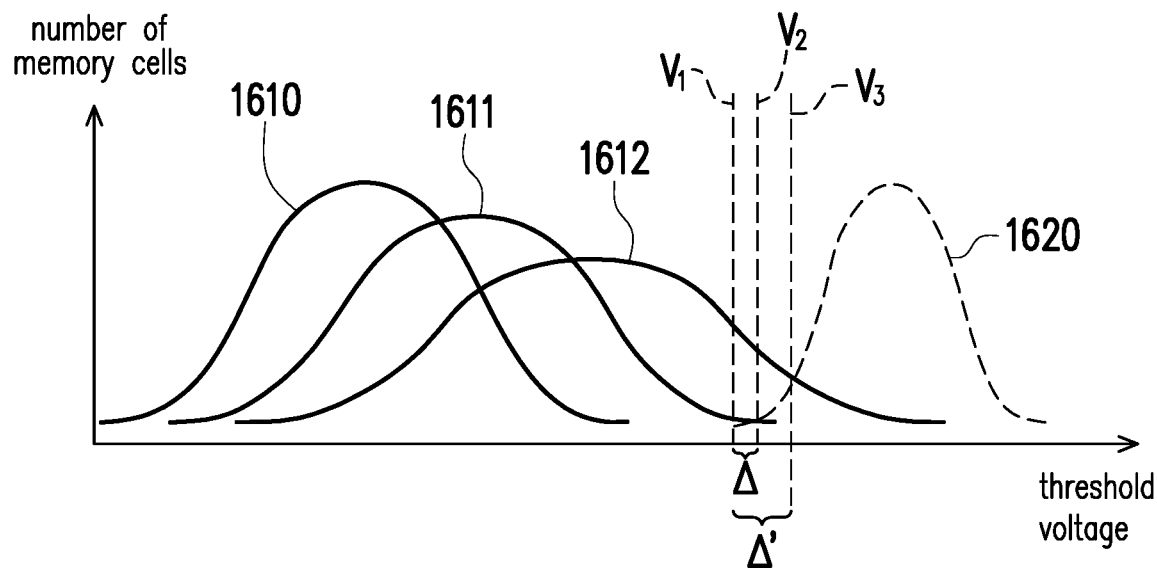
FIG. 16 is a schematic diagram of changes in threshold voltage distributions of memory cells according to an exemplary embodiment.

The following embodiment is specifically described with the read voltage level as an example. FIG. 16 is a schematic diagram of changes in threshold voltage distributions of memory cells according to an exemplary embodiment. Please refer to FIG. 16. After programming multiple memory cells in the rewritable non-volatile memory module 406, it is assumed that the threshold voltage distribution of a part of the memory cells whose storage state is in the erased state is a distribution 1610, and the threshold voltage distribution of another part of the memory cells whose storage state is in the programmed state is a distribution 1620. After the memory cells of the rewritable non-volatile memory module 406 experience performance degradation, the threshold voltage distribution of the memory cells whose storage state is in the erased state may gradually degrade from the distribution 1610 to a distribution 1611 or a distribution 1612. In this exemplary embodiment, the decoding operation includes an algorithm for searching for the optimal read voltage level. The memory management circuit 502 may execute the algorithm for searching for the optimal read voltage level to calculate a read voltage level $V_1$ for the decoding operation. In this exemplary embodiment, the memory management circuit 502 may query a lookup table according to a bit change ratio to determine a compensation value, and adjust the read voltage level $V_1$ according to the compensation value. Table 1 shows an example of the lookup table of the bit change ratio and the compensation value. The bit change ratio is the ratio of bit "1" changing to "0".

TABLE 1

| Bit change ratio | Compensation value |
| --- | --- |
| 95% | Δ |
| 85% | Δ' |
| . . . | . . . |

The threshold voltage distribution of the memory cells whose storage state is in the erased state degrading to the distribution 1611 is taken as an example. It is assumed that the current read voltage level is the read voltage level $V_1$, and the bit change ratio calculated by the memory management circuit 502 is 95%. The memory management circuit 502 looks up Table 1 to determine a compensation value $\Delta$ according to the bit change ratio 95%, and adjusts the read voltage level $V_1$ to a read voltage level $V_1+\Delta$ according to the compensation value $\Delta$. Ideally, the adjusted read voltage level $V_1+\Delta$ will conform to a read voltage level $V_2$ of the distribution 1611. In addition, if the distribution 1612 is taken as an example, it is assumed that the current read voltage level is the read voltage level $V_1$, and the bit change ratio calculated by the memory management circuit 502 is 85%. The memory management circuit 502 looks up Table 1 to determine a compensation value $\Delta'$ according to the bit change ratio 85%, and adjusts the read voltage level $V_1$ to a read voltage level $V_1+\Delta'$ according to the compensation value $\Delta'$. Ideally, the adjusted read voltage level $V_1+\Delta'$ will conform to a read voltage level $V_3$ of the distribution 1612. In this way, the memory management circuit 502 may determine the amount of compensation required for the read voltage level $V_1$ obtained by executing the algorithm for searching for the optimal read voltage level according to the bit change ratio in order to obtain the read voltage level that truly conforms to the current threshold voltage distribution of the memory cells.

In another embodiment of the disclosure, the memory management circuit 502 may also modify and execute the algorithm for searching for the optimal read voltage level according to the bit change ratio, so that the read voltage level $V_2$ or $V_3$ of the foregoing embodiment may be obtained by executing of the modified algorithm for searching for the optimal read voltage level. In this way, when the read voltage level is to be searched next time, the modified algorithm for searching for the optimal read voltage level may be executed to calculate the read voltage level for the decoding operation.

The following embodiment is specifically descried with the log likelihood ratio as an example. In this exemplary embodiment, the decoding operation includes a log likelihood ratio prediction algorithm. The memory management circuit 502 may execute the log likelihood ratio prediction algorithm to calculate the log likelihood ratio for the decoding operation. In this exemplary embodiment, the memory management circuit 502 may query a lookup table according to a bit change ratio to determine a compensation value, and adjust the log likelihood ratio according to the compensation value. Table 2 shows an example of a lookup table of the bit change ratio and the compensation value. The bit change ratio is the ratio of bit "1" changing to "0".

TABLE 2

| Bit change ratio | Compensation value |
|---|---|
| 95% | −1 |
| 85% | −2 |
| ... | ... |

It is assumed that after the memory management circuit 502 executes the log likelihood ratio prediction algorithm, the currently calculated log likelihood ratio corresponding to each voltage interval is as shown in Table 3 below, and the bit change ratio calculated by the memory management circuit 502 is 95%.

TABLE 3

| | Voltage interval | | | | | | | |
|---|---|---|---|---|---|---|---|---|
| | 1 | 2 | 3 | 4 | 5 | 6 | 7 | 8 |
| LLR | −14 | −9 | −4 | −1 | 1 | 4 | 9 | 14 |

The memory management circuit 502 looks up Table 2 according to the bit change ratio 95% to determine the compensation value −1, and subtracts 1 from the log likelihood ratio corresponding to each voltage interval to adjust the log likelihood ratio as shown in Table 4 below. In this exemplary embodiment, the highest adjustment of the log likelihood ratio of the voltage intervals 1 to 4 is to +1 when being adjusted to a positive value, and the lowest adjustment of the log likelihood ratio of the voltage intervals 5 to 8 is to −1 when being adjusted to a negative value, which is not limited by the disclosure. In this way, the memory management circuit 502 may determine the amount of compensation required for the log likelihood ratio obtained by executing the log likelihood ratio prediction algorithm in order to obtain the log likelihood ratio that truly conforms to the current threshold voltage distribution of the memory cells.

TABLE 4

| | Voltage interval | | | | | | | |
|---|---|---|---|---|---|---|---|---|
| | 1 | 2 | 3 | 4 | 5 | 6 | 7 | 8 |
| LLR | −15 | −10 | −5 | −2 | 0 | 3 | 8 | 13 |

In another embodiment of the disclosure, the memory management circuit 502 may also modify the log likelihood ratio prediction algorithm according to the bit change ratio, so that the modified log likelihood ratio prediction algorithm may obtain the log likelihood ratio as shown in Table 4 above. In this way, when the log likelihood ratio is to be calculated next time, the modified log likelihood ratio prediction algorithm may be executed to calculate the log likelihood ratio for the decoding operation.

After that, the error checking and correcting circuit 512 performs the decoding operation on the codeword by using the adjusted read voltage level or the adjusted log likelihood ratio. Specifically, after obtaining the adjusted read voltage level or the adjusted log likelihood ratio, the memory management circuit 502 may use the read voltage level to read multiple data bits from the physical programming unit (the 0-th physical programming unit of the physical erasing unit 410(F) written with the data D1-1) again to form a codeword, and the error checking and correcting circuit 512 performs the hard-bit mode decoding operation on the codeword. In addition, the error checking and correcting circuit 512 may also perform the soft-bit mode decoding operation on the originally read codeword according to the log likelihood ratio.

It should be noted that the memory management circuit 502 may also implement the methods provided in the above exemplary embodiments during the decoding operation, and the disclosure does not limit the implementation of the methods to only after the decoding operation has failed.

Figure 17:
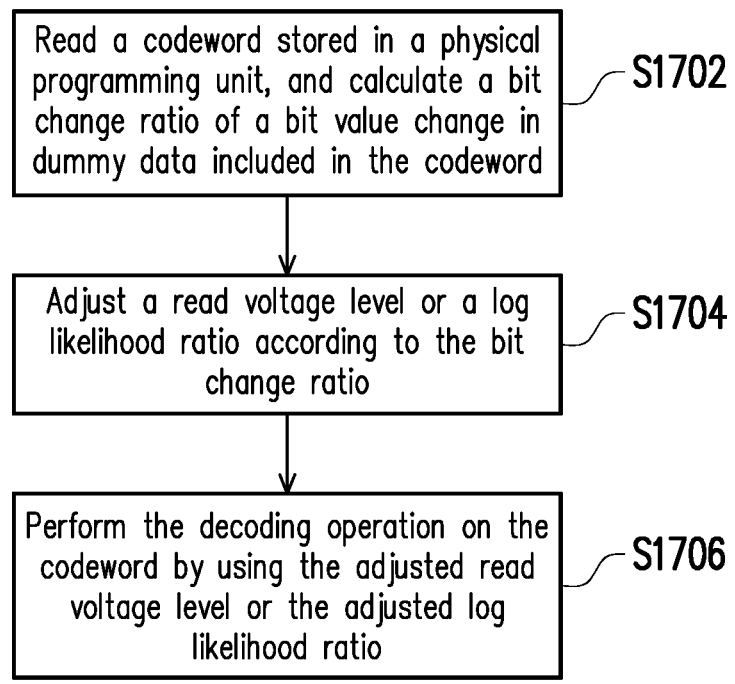
FIG. 17 is a flowchart of a data accessing method according to an exemplary embodiment.

FIG. 17 is a flowchart of a data accessing method according to an exemplary embodiment.

Please refer to FIG. 17. In Step S1702, a codeword stored in a physical programming unit is read, and a bit change ratio of a bit value change in dummy data included in the codeword is calculated. In Step S1704, a read voltage level or a log likelihood ratio is adjusted according to the bit change ratio. In Step S1706, the decoding operation is performed on the codeword by using the adjusted read voltage level or the adjusted log likelihood ratio.

However, each step in FIG. 17 has been described in detail as above and will not be repeated here. It should be noted that each step in FIG. 17 may be implemented as multiple program codes or circuits, which is not limited by the disclosure. In addition, the method of FIG. 17 may be used in conjunction with the above exemplary embodiments or may be used alone, which is not limited by the disclosure.

In summary, in the data accessing method, the memory controlling circuit unit, and the memory storage device provided by the embodiments of the disclosure, the read voltage level or the log likelihood ratio may be adjusted according to the bit change ratio of the dummy data written into the rewritable non-volatile memory module along with the data when storing the data during decoding, and the decoding operation is executed according to the adjusted read voltage level or log likelihood ratio. In addition, in the embodiments of the disclosure, the read voltage level or the log likelihood ratio may also be adjusted according to the bit change ratio of the dummy data after decoding has failed, and the decoding operation is executed again. In this way, the embodiments of the disclosure may predict the read voltage level or the log likelihood ratio that conforms to the current threshold voltage distribution of the memory cells. In addition, in view of the issue that the threshold voltage distribution of the data bit in the erased state is different from the threshold voltage distribution in other programmed states, the read voltage level or the log likelihood ratio that conforms to the threshold voltage distribution in the erased state may be obtained according to the embodiments provided by the disclosure. Accordingly, the decoding efficiency can be improved, thereby improving the efficiency and correctness of reading data.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. A data accessing method for a rewritable non-volatile memory module, wherein the rewritable non-volatile memory module comprises a plurality of physical erasing units, each of the physical erasing units has a plurality of physical programming units, the data accessing method comprising:
   receiving a write command and write data corresponding to the write command from a host system;
   programming first data to a physical programming unit among the physical programming units, wherein the first data comprises the write data, an error checking and correcting code for detecting an error in the write data, and dummy data not used in a decoding operation for detecting the error in the write data based on the error checking and correcting code, wherein bit values of all bits in the dummy data comprised in the first data are all the same;
   reading a codeword from the physical programming unit;
   obtaining a total number of at least one first bit in the dummy data comprised in the codeword, wherein a bit value of each of the at least one first bit is different from a bit value of each of at least one second bit in the dummy data comprised in the codeword;
   obtaining a bit change ratio according to the total number, wherein the total number is positively correlated to the bit change ratio;
   adjusting a read voltage level or a log likelihood ratio according to the bit change ratio; and
   performing the decoding operation on the codeword by using the adjusted read voltage level or the adjusted log likelihood ratio.

2. The data accessing method according to claim 1, wherein the step of adjusting the read voltage level or the log likelihood ratio according to the bit change ratio comprises:
   determining a compensation value according to the bit change ratio, and adjusting the read voltage level according to the compensation value.

3. The data accessing method according to claim 2, wherein the decoding operation comprises a hard-bit mode decoding operation, the data accessing method comprising:
   reading the codeword from the physical programming unit by using the adjusted read voltage level, and performing the hard-bit mode decoding operation on the codeword.

4. The data accessing method according to claim 1, wherein the step of adjusting the read voltage level or the log likelihood ratio according to the bit change ratio comprises:
   determining a compensation value according to the bit change ratio, and adjusting the log likelihood ratio according to the compensation value.

5. The data accessing method according to claim 4, wherein the decoding operation comprises a soft-bit mode decoding operation, the data accessing method comprising:
   performing the soft-bit mode decoding operation on the codeword according to the adjusted log likelihood ratio.

6. The data accessing method according to claim 1, wherein the bit values of all bits in the dummy data comprised in the first data are all "1".

7. The data accessing method according to claim 6, wherein the bit change ratio comprises a ratio of bit "1" changing to "O" in the dummy data.

8. A memory controlling circuit unit for controlling a rewritable non-volatile memory module, comprising:
   a host interface, for coupling to a host system;
   a memory interface, for coupling to the rewritable non-volatile memory module, wherein the rewritable non-volatile memory module comprises a plurality of physical erasing units, and each of the physical erasing units has a plurality of physical programming units;
   an error checking and correcting circuit; and
   a memory management circuit, coupled to the host interface, the memory interface, and the error checking and correcting circuit, wherein
   the memory management circuit is configured to receive a write command and write data corresponding to the write command from the host system,
   the memory management circuit is further configured to send a write command sequence which instructs a programming of first data to a physical programming unit among the physical programming units, wherein the first data comprises the write data, an error checking and correcting code for detecting an error in the write data, and dummy data not used in a decoding operation for detecting the error in the write data based on the error checking and correcting code, wherein bit values of all bits in the dummy data comprised in the first data are all the same, the memory management circuit is further configured to send a read command sequence which instructs a reading of a codeword from the physical programming unit, the memory management circuit is further configured to obtain a total number of at least one first bit in the dummy data comprised in the codeword, wherein a bit value of each of the at least one first bit is different from a bit value of each of at least one second bit in the dummy data comprised in the codeword, the memory management circuit is further configured to obtain a bit change ratio according to the total number, wherein the total number is positively correlated to the bit change ratio, the memory management circuit is further configured to adjust a read voltage level or a log likelihood ratio according to the bit change ratio, and the error checking and correcting circuit is further configured to perform a decoding operation on the codeword by using the adjusted read voltage level or the adjusted log likelihood ratio.

9. The memory controlling circuit unit according to claim 8, wherein the operation of adjusting the read voltage level or the log likelihood ratio according to the bit change ratio comprises:
determining a compensation value according to the bit change ratio, and adjusting the read voltage level according to the compensation value.

10. The memory controlling circuit unit according to claim 9, wherein the decoding operation comprises a hard-bit mode decoding operation, and the error checking and correcting circuit is further configured to obtain the codeword from the physical programming unit by using the adjusted read voltage level, and perform the hard-bit mode decoding operation on the codeword.

11. The memory controlling circuit unit according to claim 8, wherein the operation of adjusting the read voltage level or the log likelihood ratio according to the bit change ratio comprises:
determining a compensation value according to the bit change ratio, and adjusting the log likelihood ratio according to the compensation value.

12. The memory controlling circuit unit according to claim 11, wherein the decoding operation comprises a soft-bit mode decoding operation, and the error checking and correcting circuit is further configured to perform the soft-bit mode decoding operation on the codeword according to the adjusted log likelihood ratio.

13. The memory controlling circuit unit according to claim 8, wherein the bit values of all bits in the dummy data comprised in the first data are all "1".

14. The memory controlling circuit unit according to claim 13, wherein the bit change ratio comprises a ratio of bit "1" changing to "0" in the dummy data.

15. A memory storage device, comprising:
a connection interface unit, for coupling to a host system;
a rewritable non-volatile memory module, wherein the rewritable non-volatile memory module comprises a plurality of physical erasing units, and each of the physical erasing units has a plurality of physical programming units; and
a memory controlling circuit unit, coupled to the connection interface unit and the rewritable non-volatile memory module, wherein
the memory controlling circuit unit is configured to receive a write command and write data corresponding to the write command from the host system, the memory controlling circuit unit is further configured to send a write command sequence which instructs a programming of first data to a physical programming unit among the physical programming units, wherein the first data comprises the write data, an error checking and correcting code for detecting an error in the write data, and dummy data not used in a decoding operation for detecting the error in the write data based on the error checking and correcting code, wherein bit values of all bits in the dummy data comprised in the first data are all the same, the memory controlling circuit unit is further configured to send a read command sequence which instructs a reading of a codeword from the physical programming unit, the memory controlling circuit unit is further configured to obtain a total number of at least one first bit in the dummy data comprised in the codeword, wherein a bit value of each of the at least one first bit is different from a bit value of each of at least one second bit in the dummy data comprised in the codeword, the memory controlling circuit unit is further configured to obtain a bit change ratio according to the total number, wherein the total number is positively correlated to the bit change ratio, the memory controlling circuit unit is further configured to adjust a read voltage level or a log likelihood ratio according to the bit change ratio, and the memory controlling circuit unit is further configured to perform a decoding operation on the codeword by using the adjusted read voltage level or the adjusted log likelihood ratio.

16. The memory storage device according to claim 15, wherein the operation of adjusting the read voltage level or the log likelihood ratio according to the bit change ratio comprises:
determining a compensation value according to the bit change ratio, and adjusting the read voltage level according to the compensation value.

17. The memory storage device according to claim 16, wherein the decoding operation comprises a hard-bit mode decoding operation, and the memory controlling circuit unit is further configured to obtain the codeword from the physical programming unit by using the adjusted read voltage level, and perform the hard-bit mode decoding operation on the codeword.

18. The memory storage device according to claim 15, wherein the operation of adjusting the read voltage level or the log likelihood ratio according to the bit change ratio comprises:
determining a compensation value according to the bit change ratio, and adjusting the log likelihood ratio according to the compensation value.

19. The memory storage device according to claim 18, wherein the decoding operation comprises a soft-bit mode decoding operation, and the memory controlling circuit unit is further configured to perform the soft-bit mode decoding operation on the codeword according to the adjusted log likelihood ratio.

20. The memory storage device according to claim 15, wherein the bit values of all bits in the dummy data comprised in the first data are all "1".

21. The memory storage device according to claim 20, wherein the bit change ratio comprises a ratio of bit "1" changing to "0" in the dummy data.

* * * * *